(12) United States Patent
Aratake

(10) Patent No.: US 7,439,658 B2
(45) Date of Patent: Oct. 21, 2008

(54) PIEZOELECTRIC VIBRATOR, OSCILLATOR, ELECTRONIC PART, ELECTRONIC APPARATUS, METHOD OF FABRICATING PIEZOELECTRIC VIBRATOR AND METHOD OF FABRICATING ELECTRONIC PART

(75) Inventor: Kiyoshi Aratake, Chiba (JP)

(73) Assignee: Seiko Instruments Inc., Chiba (JP)

( * ) Notice: Subject to any disclaimer, the term of this patent is extended or adjusted under 35 U.S.C. 154(b) by 152 days.

(21) Appl. No.: 11/506,055

(22) Filed: Aug. 17, 2006

(65) Prior Publication Data
US 2007/0044565 A1   Mar. 1, 2007

(30) Foreign Application Priority Data
Aug. 24, 2005 (JP) .............. 2005-242319
Apr. 14, 2006 (JP) .............. 2006-112125

(51) Int. Cl.
*H01L 41/053* (2006.01)
(52) U.S. Cl. .................................... 310/344
(58) Field of Classification Search .............. 310/344, 310/348
See application file for complete search history.

(56) References Cited
U.S. PATENT DOCUMENTS
5,635,672 A * 6/1997 Kawaura ............... 174/564
6,229,249 B1 * 5/2001 Hatanaka et al. .......... 310/348
7,256,659 B2 * 8/2007 Mizumura et al. ........ 331/68
7,259,501 B2 * 8/2007 Usuda ...................... 310/344

FOREIGN PATENT DOCUMENTS
JP   2000-68780       3/2000
JP   2007-129327 A *  5/2007

* cited by examiner

Primary Examiner—Thomas M Dougherty
(74) Attorney, Agent, or Firm—Brinks Hofer Gilson & Lione

(57) ABSTRACT

To provide a piezoelectric vibrator, an oscillator, an electronic part, an electronic apparatus, a method of fabricating a piezoelectric vibrator and a method of fabricating an electronic part capable of swiftly and easily providing a plurality of electrodes for applying a voltage to a piezoelectric vibrating piece while maintaining airtightness at inside of a hermetically sealed vessel, there is provided a piezoelectric vibrator including a hermetically sealed vessel 2 constituted by overlapping a lid member 6 and a base member 7 in a plate-like shape, a piezoelectric vibrating piece 3 provided at inside of the hermetically sealed vessel 2, a lead-out electrode 16 provided at an overlapping face 6a of the lid member 6, electrically connected to the piezoelectric vibrating piece 3 by way of a connecting portion, and extending the connecting portion 15 to an edge portion of the overlapping face 6a of the lid member 6, an external electrode 27 electrically connected to the lead-out electrode 16 from a side face of the hermetically sealed vessel 2, and a bonding film 20 comprising a metal or silicone provided between the overlapping face 6a of the lid member 6 and an overlapping face 7a of the base member 7, in which an insulating film 22 is provided between the lead-out electrode 16 and the bonding film 20.

7 Claims, 20 Drawing Sheets

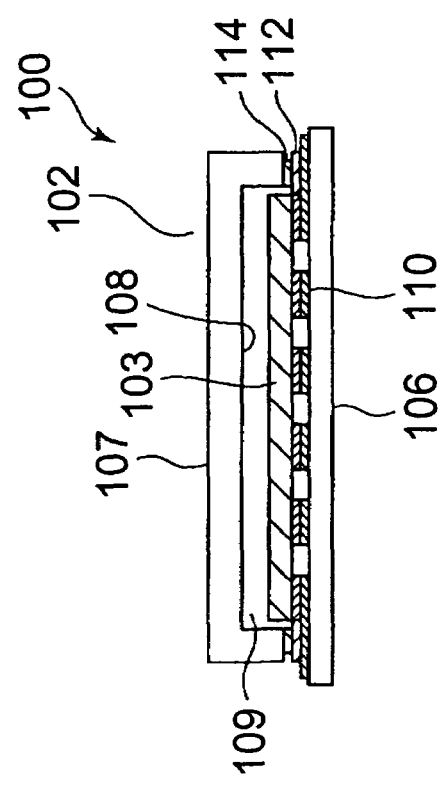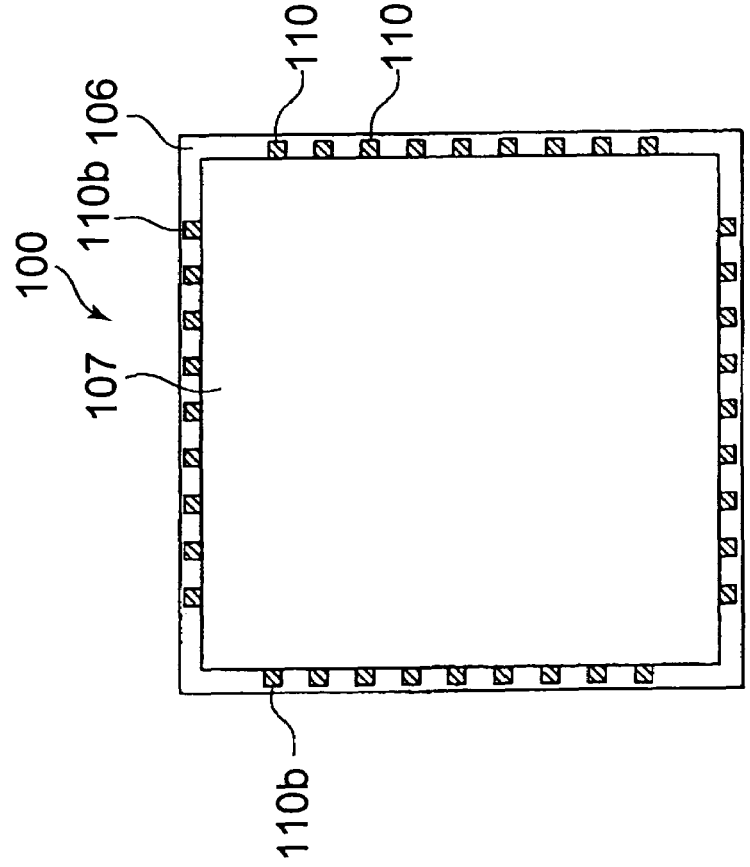
FIG. 29B
FIG. 29A

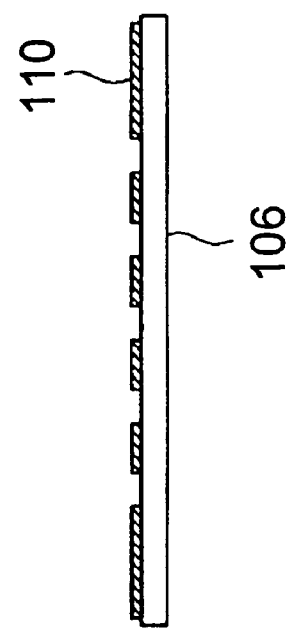
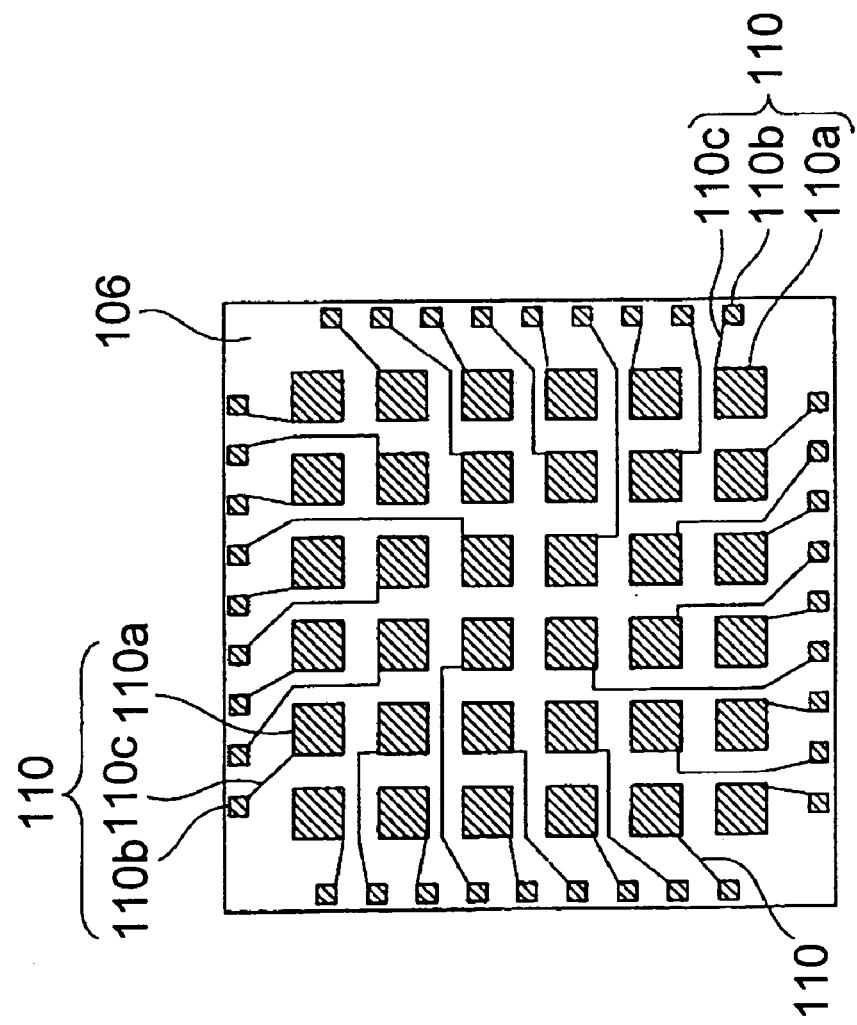

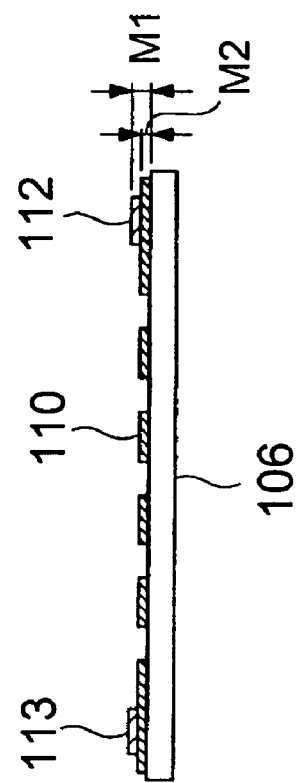
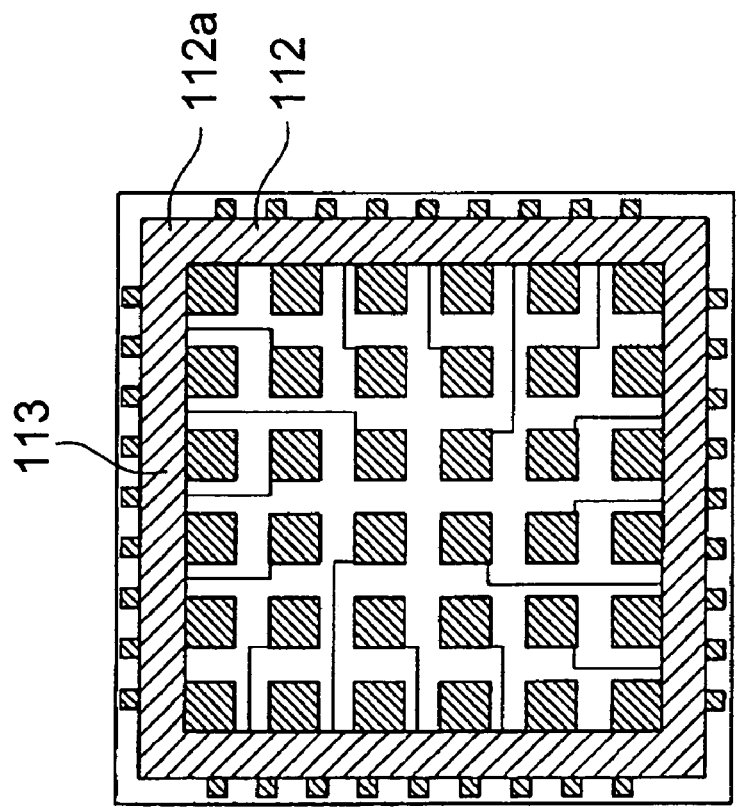
FIG. 32B
FIG. 32A

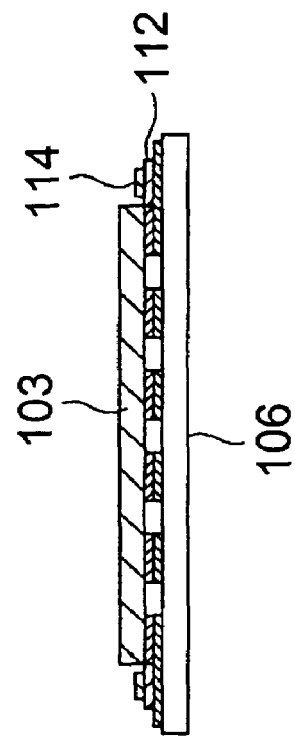
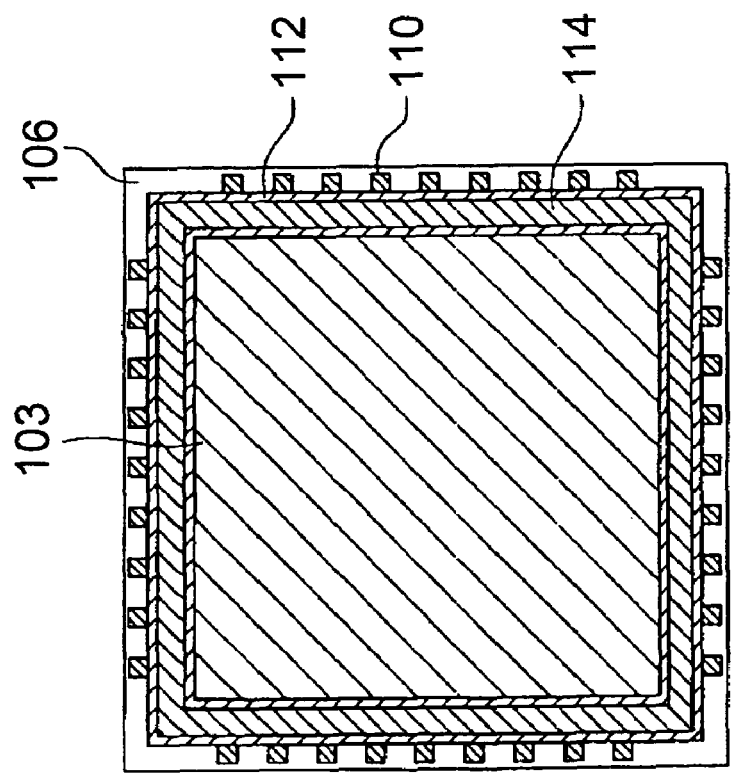

PIEZOELECTRIC VIBRATOR, OSCILLATOR, ELECTRONIC PART, ELECTRONIC APPARATUS, METHOD OF FABRICATING PIEZOELECTRIC VIBRATOR AND METHOD OF FABRICATING ELECTRONIC PART

This application claims priority under 35 U.S.C. § 119 to Japanese Patent Application Nos. JP2005-242319 filed Aug. 24, 2005 and JP2006-112125 filed Apr. 14, 2006, the entire content of which is hereby incorporated by reference.

BACKGROUND OF THE INVENTION

1. Field of the Invention

The present invention relates to a piezoelectric vibrator, an oscillator, an electronic part, an electronic apparatus, a method of fabricating a piezoelectric vibrator and a method of fabricating an electronic part.

2. Description of the Related Art

In recent years, there are utilized various electronic parts, for example, a piezoelectric vibrator as a time source, a timing source of a control signal or the like in a portable telephone or a portable information terminal apparatus. There is a piezoelectric vibrator including a hermetically sealed vessel constituted by overlapping a base member and a lid member, and a piezoelectric vibrating piece provided at inside of the hermetically sealed vessel. The inside is hermetically sealed by the hermetically sealed vessel for stabilizing a vibrating characteristic of the piezoelectric vibrating piece by maintaining a periphery of the piezoelectric vibrating piece in a vacuum state. It is well known that the piezoelectric vibrator is provided with a bonding film comprising a metal of aluminum or the like between the base member and the lid member for bonding the base member and the lid member (refer to, for example, Patent Reference 1).

However, when such a bonding film comprising a metal is provided, a plurality of lead-out electrodes for applying a voltage to the piezoelectric vibrating piece cannot be extended on an overlapping face between the lid member and the base member. Because when the bonding film is provided between the lid member and the base member, the bonding film and the plurality of lead-out electrodes interfere with each other and the plurality of lead-out electrodes are short-circuited.

Hence, it is conceivable to provide a through hole communicating with inside of the hermetically sealed vessel or the like at, for example, the base member and connecting the piezoelectric vibrating piece and an external electrode by way of the through hole.

[Patent Reference 1] JP-A-2000-68780

However, according to the constitution for providing the through hole as described above, a small clearance is liable to be brought about at inside of the through hole by various factors of aging deterioration, impact or the like to pose a problem that outside air invades the inside of the hermetically sealed vessel from the clearance. When the outside air invades the inside of the hermetically sealed vessel, an influence is effected on the vibrating characteristic of the piezoelectric vibrating piece. According thereto, the more the through holes are provided, the more serious is the problem. Further, when the piezoelectric vibrator is further downsized by a request of small-sized formation and high density formation of a portable terminal information apparatus in recent years, provision per se of providing the through hole functioning properly becomes difficult.

Further, when a device of a piezoelectric vibrating piece or the like is of a multiterminals type, a number of the through holes need to be formed at the base member or the lid member, in this case, space is restricted and a reduction in a strength thereof is brought about and therefore, the case cannot meet the request for small-sized formation and high density formation.

SUMMARY OF THE INVENTION

The invention has been carried out in view of such a situation and it is an object thereof to provide a piezoelectric vibrator, an oscillator, an electronic part, an electronic apparatus, a method of fabricating a piezoelectric vibrator and a method of fabricating an electronic part capable of swiftly and easily providing a plurality of electrodes for applying a voltage to a device of a piezoelectric vibrating piece or the like, in addition thereto, capable of realizing small-sized formation and high density formation while maintaining airtightness at inside of a hermetically sealed vessel over a long period of time.

The invention provides the following means in order to resolve the above-described problem.

According to the invention, there is provided a piezoelectric vibrator comprising a hermetically sealed vessel constituted by overlapping a lid member and a base member in a plate-like shape in a thickness direction, a piezoelectric vibrating piece provided at inside of the hermetically closed vessel, a lead-out electrode provided at an overlapping face of the lid member, electrically connected to the piezoelectric vibrating piece by way of a connecting portion, and extending the connecting portion to an edge portion of the overlapping face of the lid member, an external electrode electrically connected to the lead-out electrode from a side face of the hermetically closed vessel, and a bonding film comprising a metal provided between the overlapping face of the lid member and an overlapping face of the base member, wherein an insulating film is provided between at least the lead-out electrode and the bonding film in between the overlapping face of the lid member and the overlapping face of the base member.

According to the piezoelectric vibrator according to the invention, the lid member and the base member are easily bonded by way of the bonding film, and the external electrode is formed from the side face of the hermetically sealed vessel. Further, when a voltage is applied to the external electrode, the voltage is applied to the piezoelectric vibrating piece by way of the lead-out electrode and the connecting portion. At this occasion, since the insulating film is provided at least between the lead-out electrode and the bonding film, the lead-out electrode and the bonding film can be prevented from being conducted electrically. Further, the external electrode is connected to the lead-out electrode from the side face of the hermetically sealed vessel and therefore, it is not necessary to provide a through hole or the like at, for example, a bottom face or the like of the hermetically sealed vessel.

Further, "at least" signifies that the insulating film may be provided between the lead-out electrode and the bonding film at a minimum, and the insulating film may be provided also at a portion at other than therebetween. For example, the insulating film may be provided to be widened over the overlapping face of the lid member from the lead-out electrode, or the insulating film may be provided at one face of the overlapping face of the lid member including the lead-out electrode (excluding the connecting portion) or at an entire periphery of an edge portion of the overlapping face.

Further, according the piezoelectric vibrator according to the invention, the lid member and the base member comprise glass, and wherein the lid member and the base member are anodically bonded by way of the bonding film.

In the piezoelectric vibrator according to the invention, the lid member and the base member comprising glass are anodically bonded by way of the bonding film.

Thereby, the thermal expansion coefficients of the lid member and the base member can be matched, and the lid member and the base member can firmly be bonded with excellent accuracy.

Further, according to the piezoelectric vibrator according to the invention, the overlapping face of the lid member comprises an electrode face at which the lead-out electrode is extended and a nonelectrode face, and wherein the insulating film is provided over the lead-out electrode and the nonelectrode face, and a surface of the insulating film on a side of the base member is formed with a flattening portion leveled by being flattened.

In the piezoelectric vibrator according to the invention, the insulating film is provided over the lead-out electrode and the nonelectrode face, and the flat portion leveled by being flattened is formed on the surface of the lid insulating film on the side of the base member.

Thereby, the surface of the insulating film can be made to be uniform by absorbing a height difference between the lead-out electrode and the nonelectrode face, and the lid member and the base member can firmly be bonded with further excellent accuracy.

According to the piezoelectric vibrator according to the invention, at least three of the lead-out electrodes are provided.

Further, according to the piezoelectric vibrator according to the invention, a plurality of the piezoelectric vibrating pieces are provided.

In the piezoelectric vibrator according to the invention, at least three of the lead-out electrodes are provided, further, a plurality of the piezoelectric vibrating pieces are provided and therefore, various requests of an apparatus or the like integrated with the piezoelectric vibrator can easily be met.

Further, according an oscillator according to the invention, the above-described piezoelectric vibrator is electrically connected to an integrating circuit as an oscillation piece. Further, an electronic apparatus according to the invention comprises the above-described piezoelectric vibrator.

In the oscillator and the electronic apparatus according to the invention, an effect similar to that of the above-described piezoelectric vibrator can be achieved.

Further, according to the invention, there is provided a method of fabricating a piezoelectric vibrator which is a method of fabricating a piezoelectric vibrator including a hermetically sealed vessel constituted by overlapping a lid member and a base member in a plate-like shape in a thickness direction, and a piezoelectric vibrating piece provided at inside of the hermetically sealed vessel, the method comprising an electrode forming step of forming a connecting portion connected to the piezoelectric vibrating piece and a lead-out electrode for extending the connecting portion to an edge portion of an overlapping face of the lid member at the overlapping face of the lid member, an insulating film forming step of forming an insulating film at least on the lead-out electrode formed by the electrode forming step, a bonding film forming step of forming a bonding film comprising a metal or silicone for bonding the lid member and the base member onto the insulating film formed at the insulating film forming step, a connecting step of electrically connecting the piezoelectric vibrating piece to the connecting portion formed at the electrode forming step, a bonding step of bonding the lid member and the base member by interposing the piezoelectric vibrating piece connected in the connecting step by way of the bonding film formed at the bonding film forming step, and an external electrode forming step of electrically connecting an external electrode to the lead-out electrode from a side face of the hermetically sealed vessel having the lid member and the base member bonded at the bonding step.

According to the method of fabricating the piezoelectric vibrator according to the invention, in the electrode forming step, the overlapping face of the base member is formed with the connecting portion and the lead-out electrode, and in the insulating film forming step, the insulating film is formed at least on the lead-out electrode. Further, in the bonding film forming step, the bonding film is formed on the insulating film, and in the connecting step, the piezoelectric vibrator is electrically connected to the connecting portion. Further, in the bonding step, the lid member and the base member are bonded by way of the bonding film by interposing the piezoelectric vibrating piece, and in the external electrode forming step, the external electrode is electrically connected to the lead-out electrode from the side face of the hermetically sealed vessel.

Thereby, the insulating film is provided at least between the lead-out electrode and the bonding film and therefore, the piezoelectric vibrator preventing the lead-out electrode and the bonding film from being electrically conducted can be provided. Further, since the external electrode is connected to the lead-out electrode from the side face of the hermetically sealed vessel, it is not also necessary to provide a through hole or the like at, for example, a bottom face or the like from the hermetically sealed vessel.

Further, "at least" signifies that the insulating film may be provided on the lead-out electrode at a minimum, and may be provided also at a portion other than on the lead-out electrode.

According to the invention, there is provided an electronic part comprising a hermetically sealed vessel constituted by overlapping a lid member and a base member in a plate-like shape in a thickness direction, a device provided at inside of the hermetically sealed vessel, a plurality of lead-out electrodes each provided at an overlapping face of either one of the lid member and the base member, and including an inner side connecting portion electrically connected to the device, an outer side connecting portion provided at an edge portion of the overlapping face of one of the lid member and the base member, and a wiring portion for electrically connecting the inner side connecting portion and the outer side connecting portion, and an insulating film provided at the overlapping face of the one of the lid member and the base member to cover the plurality of lead-out electrodes.

In the electronic part according to the invention, when a voltage is applied to the external connecting portion, the voltage is applied to the device by way of the wiring portion and the inner side connecting portion. Further, since the external electrode is connected to the external connecting portion of the lead-out electrode exposed to a side portion of the hermetically sealed vessel, it is not necessary to provide a through hole or the like at, for example, a bottom face or the like of the hermetically sealed vessel.

Further, according to the electronic part according to the invention, the lid member and the base member are bonded by any bonding means of room temperature bonding, anodic bonding, or direct bonding.

In the electronic part according to the invention, bonding means of room temperature bonding, anodic bonding, direct bonding or the like is used and therefore, the lid member and the base member can firmly be bonded with excellent accuracy.

Further, according to the electronic part according to the invention, a face of the insulating film opposed to an overlapping face of other of the lid member and the base member is formed in a flat shape leveled by being flattened.

In the electronic part according to the invention, one face of the insulating film is formed in a flat shape and therefore, a recessed and protruded portion which is liable to be produced at overlapping portions of the lid member and the base member by arranging the lead-out electrode can be leveled in a flat shape. Thereby, the lid member and the base member can firmly be bonded with further excellent accuracy while ensuring high sealing performance.

Further, according to the electronic part according to the invention, the lid member and the base member in the plate-like shape are bonded by anodic bonding, and wherein a bonding film comprising a metal or silicone for anodically bonding the lid member and the base member in the plate-like shape is formed between an overlapping face of other of the lid member and base member and the insulating film.

In the electronic part according to the invention, the bonding film comprising the metal or silicone is formed between other overlapping face of the lid member and the base member and the insulating film and therefore, the lid member and the base member can anodically bonded by utilizing the bonding film. Therefore, a glass material can be utilized for the lid member or the base member and the electronic part which is inexpensive and stable can be provided.

Further, according to the invention, there is provided a method of fabricating an electronic part which is a method of fabricating an electronic part comprising a hermetically closed vessel constituted by overlapping a lid member and a base member in a plate-like shape in a thickness direction, and a device provided at inside of the hermetically closed vessel, the method comprising an electrode forming step of forming a plurality of lead-out electrodes extended from inner side connecting portions electrically connected to the device to outer side connecting portions provided at an edge portion of an overlapping face of either one of the lid member and the base member at the overlapping face of one of the lid member and the base member, an insulating film forming step of forming an insulating film at the one overlapping face to cover the plurality of lead-out electrodes formed at the electrode forming step, a device mounting step of electrically connecting the device to the lead-out electrode formed at the electrode forming step, and a bonding step of bonding the lid member and the base member in a state of arranging the device mounted at the device mounting step at inside thereof.

In the method of fabricating the electronic part according to the invention, in the electrode forming step, the lead-out electrode is formed at the overlapping face of the base member, and in the insulating film forming step, the insulating film is formed to cover the lead-out electrode. Further, in the device mounting step, the device is electrically connected to the lead-out electrode. Further, in the bonding step, the lid member and the base member are bonded in the state of arranging the device at inside thereof. Further, the external electrode is connected to the lead-out electrode from the side face of the hermetically sealed vessel and therefore, it is not also necessary to provide a through hole or the like at, for example, a bottom face or the like of the hermetically sealed vessel.

According to the invention, it is not necessary to provide a through hole or the like, the lead-out electrodes can be prevented from being electrically conducted and therefore, the plurality of electrodes for applying the voltage to the device of the piezoelectric vibrating piece or the like can swiftly and easily be provided, and also small-sized formation and high density formation can be dealt with while maintaining air-tightness at inside of the hermetically sealed vessel over a long period of time.

BRIEF DESCRIPTION OF THE DRAWINGS

FIGS. 29A and 29B illustrate views of an electronic part according to a sixth embodiment of the invention, FIG. 29A is a plane view, and FIG. 29B is a sectional view, FIG. 30A is a plane view, and FIG. 30B is a sectional view, FIGS. 31A and 31B illustrate views showing a step of the method of fabricating the electronic part according to the sixth embodiment of the invention, FIG. 31A is a plane view, and FIG. 31B is a sectional view, FIGS. 32A and 32B illustrate views showing a step of the method of fabricating the electronic part according to the sixth embodiment of the invention, FIG. 32A is a plane view, and FIG. 32B is a sectional view, FIG. 33A is a plane view, and FIG. 33B is a sectional view, FIGS. 34A and 34B illustrate views showing a step of the method of fabricating the electronic part according to the sixth embodiment of the invention, FIG. 34A is a plane view, and FIG. 34B is a sectional view.

DETAILED DESCRIPTION OF THE PREFERRED EMBODIMENTS

Embodiment 1

An explanation will be given of a quartz crystal vibrator (piezoelectric vibrator) according to a first embodiment of the invention in reference to the drawings as follows.

Figure 1:
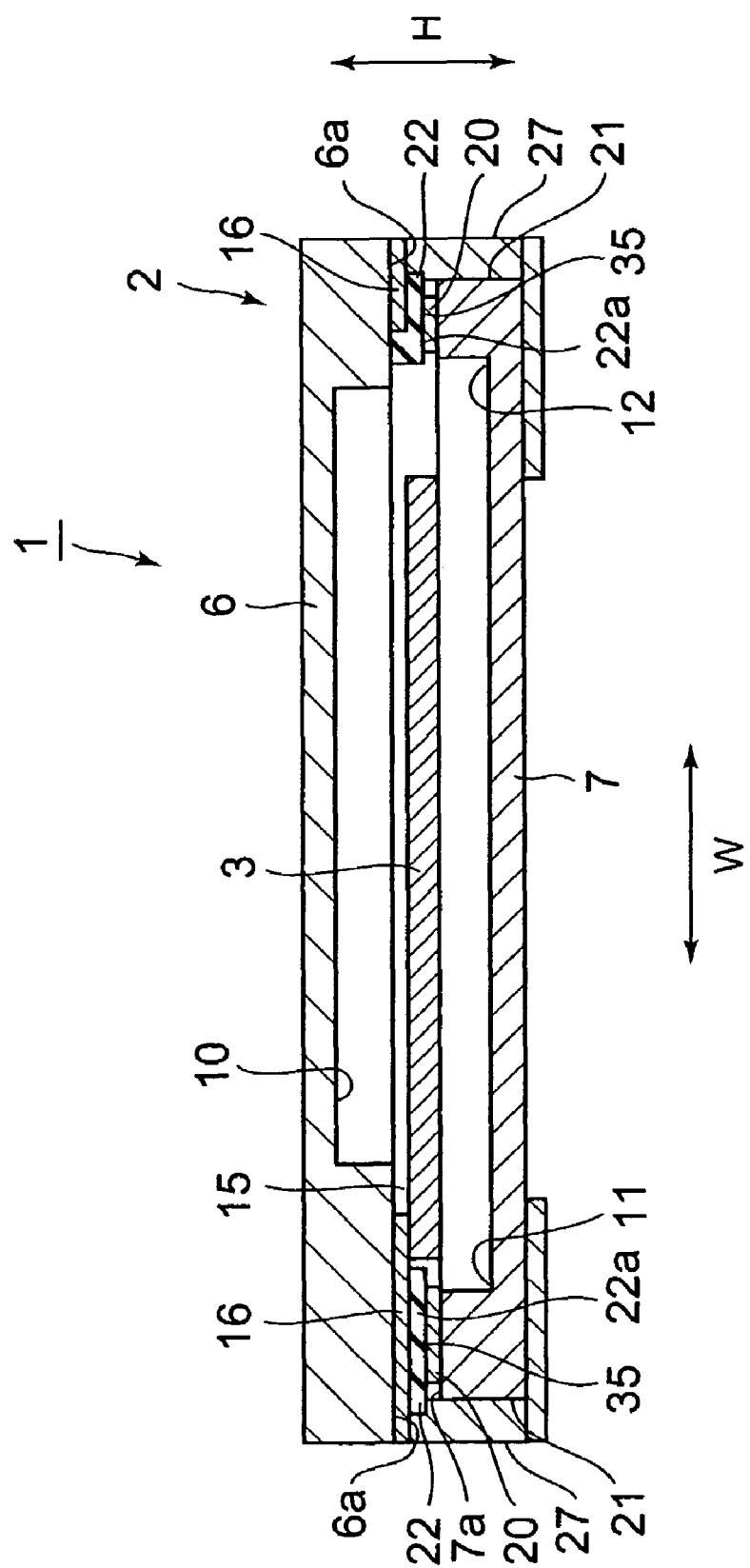
FIG. 1 is a sectional view showing a behavior when a quartz crystal vibrator according to a first embodiment of the invention is viewed from a side face thereof.

In FIG. 1, notation 1 designates a quartz crystal vibrator.

The quartz crystal vibrator 1 includes a hermetically sealed vessel 2 formed substantially in a rectangular shape and a quartz crystal vibrating piece (piezoelectric vibrating piece) 3 provided at inside of the hermetically sealed vessel 2.

The quartz crystal vibrating piece 3 is constituted as a tuning fork type vibrating piece in which two of vibrating arms 3a (shown in FIG. 13) extended in parallel with each other are integrally connected respectively at base end sides thereof. A base end portion of the quartz crystal vibrating piece 3 is electrically connected to a connecting portion 15 mentioned later, thereby, supported in the form of a cantilever to be fixed inside of the hermetically sealed vessel 2. Further, the quartz crystal vibrating piece 3 comprises quartz and is vibrated at a predetermined frequency by applying a voltage thereto.

Further, the hermetically sealed vessel 2 is constituted by overlapping a lid member 6 and a base member 7 substantially in a shape of rectangular plates in respective thickness directions thereof.

One main face 6a of two main faces of the lid member 6 is formed with a lid side recess portion 10 in a rectangular shape. Similarly, one main face 7a of the base member 7 is formed with a base side recess portion 11 in a rectangular shape. Further, the lid member 6 and the base member 7 are bonded by overlapping the one main face 6a and the main face 7a in a state in which the lid side recess portion 10 and the base side recess portion 11 are opposed to each other. That is, the one main face 6a is made to function as an overlapping face of the lid member 6, and the one main face 7a is made to function as an overlapping face of the base member 7. By making the lid side recess portion 10 and the base side recess portion 11 opposed to each other in this way, a cavity portion 12 is formed at inside of the hermetically sealed vessel 2, and the quartz crystal vibrating piece 3 is permitted to vibrate by the cavity portion 12. Inside of the hermetically sealed vessel 2 is sealed in airtight and the cavity portion 12 is maintained in a vacuum state.

The connecting portion 15 electrically connected to the quartz crystal vibrating piece 3 and a lead-out electrode 16 extending the connecting portion 15 to an edge portion of the one main face 6a are provided on the one main face 6a of the lid member 6.

Figure 4:
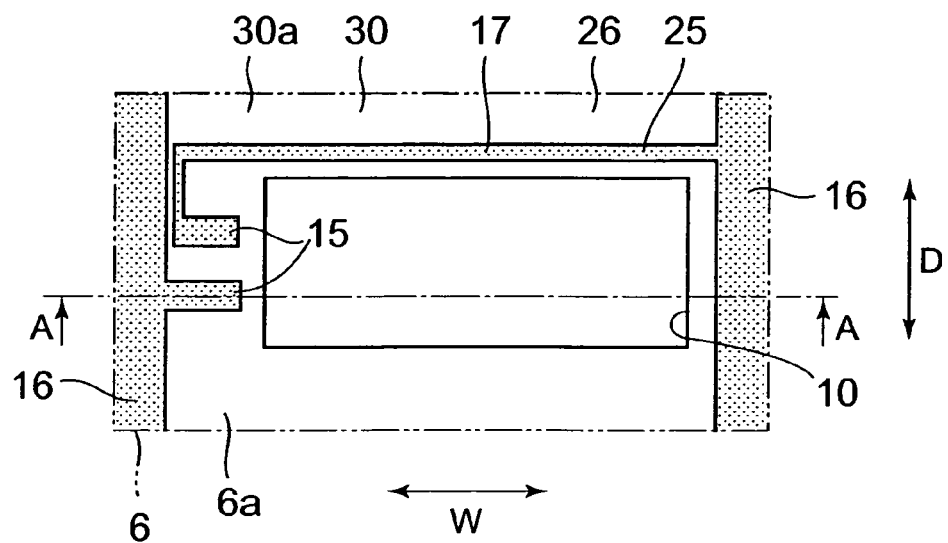
FIG. 4 is a plane view showing a behavior of forming a lead-out electrode at the wafer for the lid portion in a step of fabricating the quartz crystal vibrator of FIG. 1.

The connecting portion 15 and the lead-out electrode 16 comprise an electrically conductive member of, for example, Cr, Ti or the like. As shown by FIG. 4, two of the connecting portions 15 are provided on one end side in a length direction of the lid side recess portion 10, and the two connecting portions 15 are made to function as positive and negative electrode terminals for applying a voltage to the quartz crystal vibrating piece 3. The lead-out electrodes 16 are provided at both ends in a width direction (length direction) of W of the lid member 6, and the lead-out electrodes 16 at the both ends are provided over an entire length in a depth direction D. In the lead-out electrodes 16 at the both ends, one lead-out electrode 16 is integrally connected to one connecting portion 15, and other lead-out electrode 16 is integrally connected to other connecting portion 15 by way of a lead-out portion 17. Further, a face of the one main face 6a at which the connecting portion 15 and the lead-out electrode 16 are extended constitutes an electrode face 25 and a face thereof at which the connecting portion 15 and the lead-out electrode 16 are not extended other than the electrode face 25 constitutes a nonelectrode face 26.

Further, as shown by FIG. 1, the one main face 7a of the base member 7 is interposed with a bonding film 20 comprising, for example, Cr, silicone or the like.

Further, four corners of the bonding film 20 are removed in a shape of a circular arc, and four corners of the base member 7 opposed to each other are provided with external terminal connecting portions 21 by following the shape of the circular arc.

Figure 6:
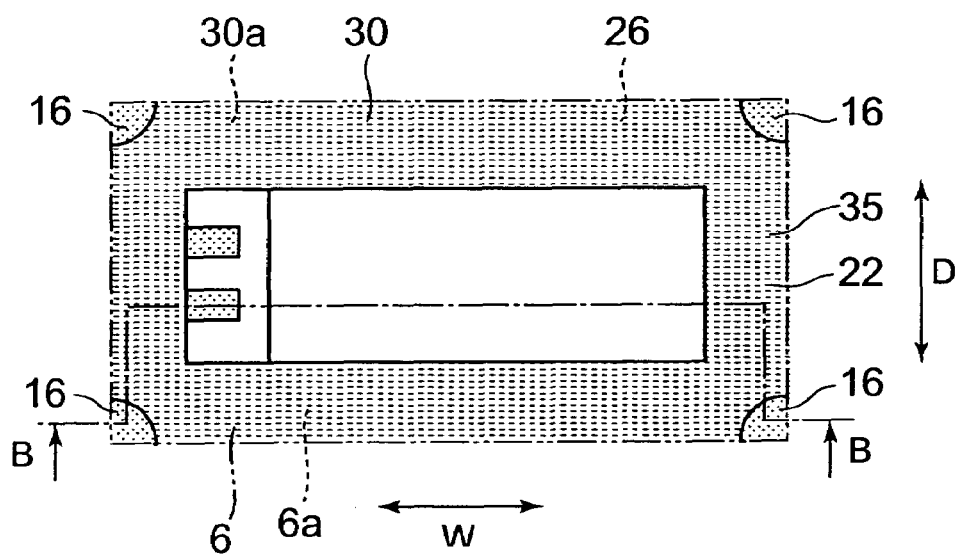
FIG. 6 is a plane view showing a behavior of forming an insulting film at the wafer for the lid portion in a step of fabricating the quartz crystal vibrator of FIG. 1.

Further, the quartz crystal vibrator 1 according to the embodiment includes an insulting film 22 comprising, for example, $SiO_2$, $Si_3N_4$ or the like. As shown by FIG. 6, the insulting film 22 is provided to be widened over surfaces of the lead-out electrodes 16 and the nonelectrode face 26, and provided over an entire periphery of an edge portion of the one main face 6a including the lead-out electrodes 16. Four corners of the insulating films 22 are removed by following the circular arc shape of the external terminal connecting portion 21. The above-described bonding film 20 is provided on the insulating film 22. Further, as shown by FIG. 1, a surface (base member side surface) 22a of the insulating film 22 arranged on a side of the base member 7 is formed with a flat portion 35 constituted by flattening the surface 22a. The surface 22a is leveled by the flat portion 35.

Further, although in FIG. 1, a thickness of a total of a film at a portion of overlapping the lead-out electrode 16, the insulting film 22, the bonding film 20 in a shape of layers is shown to be thicker than a thickness of the quartz crystal vibrating piece 3, this is because the constitution of the film is exaggeratedly drawn to be easy to understand, and actually, the quartz crystal vibrating piece 3 is thicker than the total of the film.

Further, the lid member 6 and the base member 7 according to the embodiment comprise, for example, glass and the lid member 6 and the base member 7 are anodically bonded by way of the bonding film 20.

Figure 16:
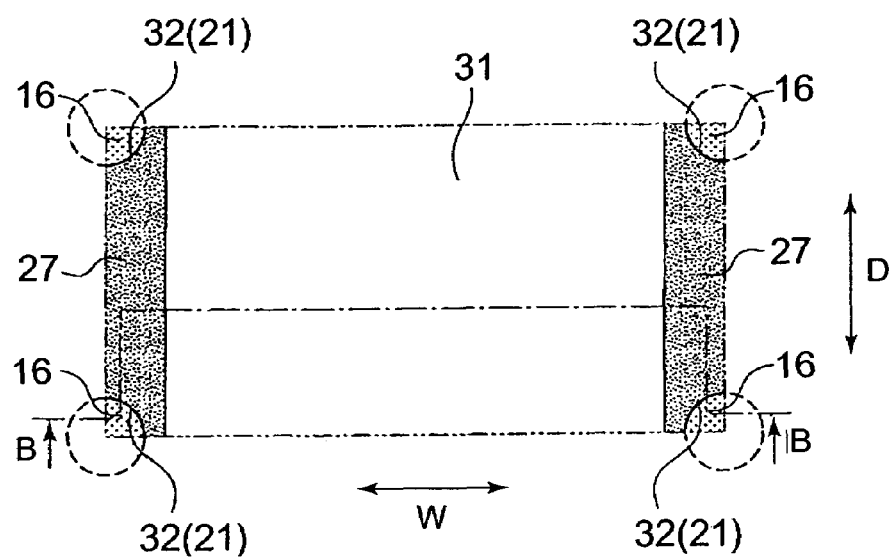
FIG. 16 is a plane view showing a behavior of forming an external electrode at the wafer for the base in a step of fabricating the quartz crystal vibrator of FIG. 1.

Further, an external terminal connecting portion 21 according to the embodiment is provided with an external terminal (external electrode) 27. One end in a height direction H of the hermetically sealed vessel 2 of the external terminal 27 is electrically connected to the lead-out electrode 16, and other end thereof is extended to a bottom face portion (other main face of the base member 7) of the hermetically sealed vessel 2. That is, the external terminal 27 is connected from a side face of the hermetically sealed vessel 2 to the lead-out electrode 16. Further, the external terminals 27 are formed by constituting a pair thereof. That is, as shown by FIG. 16, the external terminal 27 is extended over between two of the external terminal connecting portions 21 formed on one end side in the width direction W in the external terminal connecting portions 21 at the four corners, similarly, extended over between two of the external terminal connecting portions 21 formed on other end side in the width direction W. Further, the pair of external terminals 27 are connected to the one lead-out electrode 16 or the other lead out electrode 16 and are made to function as positive and negative external electrodes for applying the voltage to the quartz crystal vibrating piece 3.

Under such a constitution, when a predetermined voltage is applied to the external terminal 27, the voltage is applied to the quartz crystal vibrating piece 3 by way of the lead-out electrode 16 and the connecting portion 15. Then, by a piezoelectric effect, the vibrating arms 3a are flexurally moved with a predetermined period in directions of being proximate to each other or remote from each other, that is, by a mode of reverse phases.

Next, an explanation will be given of a method of fabricating the quartz crystal vibrator 1 according to the embodiment.

Figure 2:
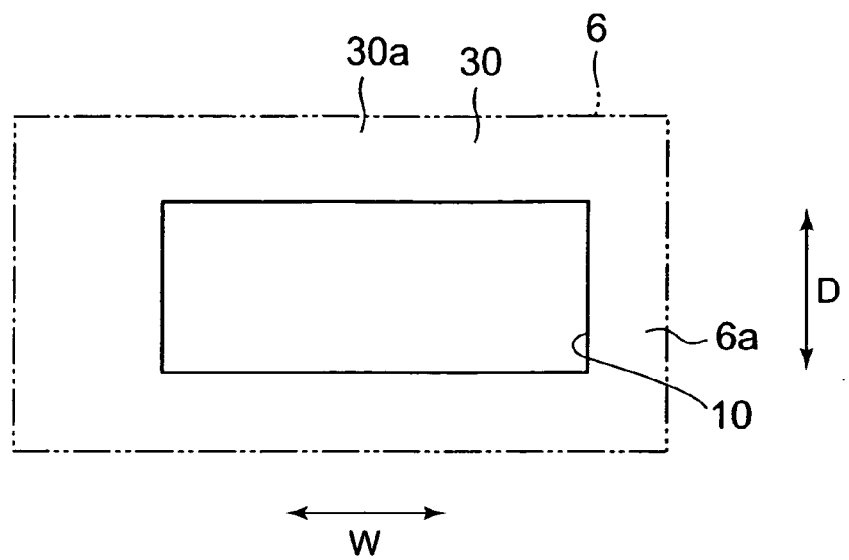
FIG. 2 is a plane view showing a behavior of forming a lid side recess portion at a wafer for a lid portion in a step of fabricating the quartz crystal vibrator of FIG. 1.
Figure 3:
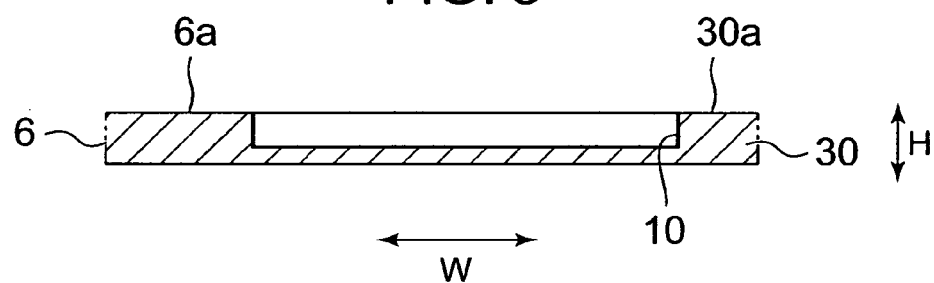
FIG. 3 is a side view showing the wafer for the lid portion of FIG. 2.

First, the lid member 6 is machined to form. That is, as shown by FIG. 2 and FIG. 3, a wafer 30 for the lid portion comprising glass is polished to constitute a predetermined thickness and cleaned. Further, a work alterated layer at the topmost surface is removed by etching or the like. Further, a plurality of the lid side recess portions 10 are formed at one main face 30a of the wafer 30 for the lid portion by etching or the like. Further, although in FIG. 2 and FIG. 3, only one of the lid side recess portion 10 is clearly shown for simplifying explanation, actually, a plurality of the lid side recess portions 10 are continuously formed in row and column directions over an entire face of the one main face 30a of the wafer 30 for the lid portion. That is, the wafer 30 for the lid portion is aligned with and integrally formed with a plurality of the lid members 6, here, the wafer 30 for the lid portion corresponds to the lid member 6. Further, the one main face 30a of the wafer 30 for the lid portion corresponds to the one main face 6a of the lid member 6, that is, the overlapping face of the lid member 6.

Further, the base member 7 is machined to form. That is, a plurality of the base side recess portions 11 are formed at one main face 31a of the wafer 31 for the base comprising glass shown in FIG. 15 similar to the lid member 6. Also here, the wafer 31 for the base corresponds to the base member 7, and the one main face 31a of the wafer 31 for the base corresponds to the one main face 7a of the main base member 7.

Successively, respectives of four corners of a rectangular shape when each of the base side recess portion 11 is surrounded by the rectangular shape having a predetermined size are provided with through holes 32 shown in FIG. 16. Although the through hole 32 is divided by four in a dicing step, mentioned later, the portion divided in four constitutes the above-described external terminal connecting portion 21.

Further, the tuning fork type quartz crystal vibrating piece 3 is machined to form by polishing and etching artificial quartz.

Figure 5:
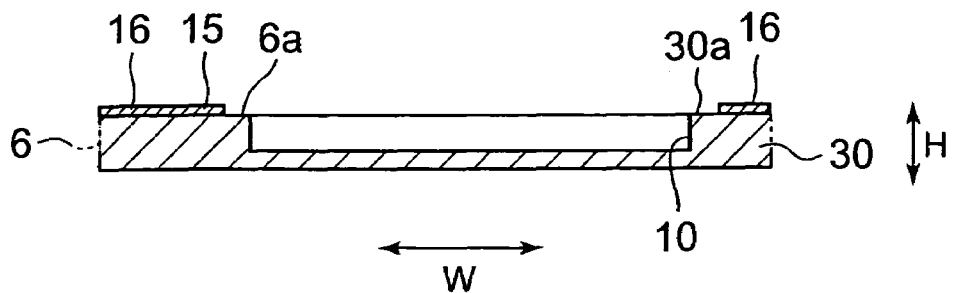
FIG. 5 is a sectional view taken along a line A-A of FIG. 4.

Thereafter, as shown by FIG. 4 and FIG. 5, the one main face 30a of the wafer 30 for the lid portion is formed with the connecting portion 15 and the lead-out electrode 16 (electrode forming step). That is, the one main face 30a is formed with an electrode layer by sputtering or vapor deposition and integrally patterned with the connecting portion 15 and the lead-out electrode 16 by etching or the like.

Figure 7:
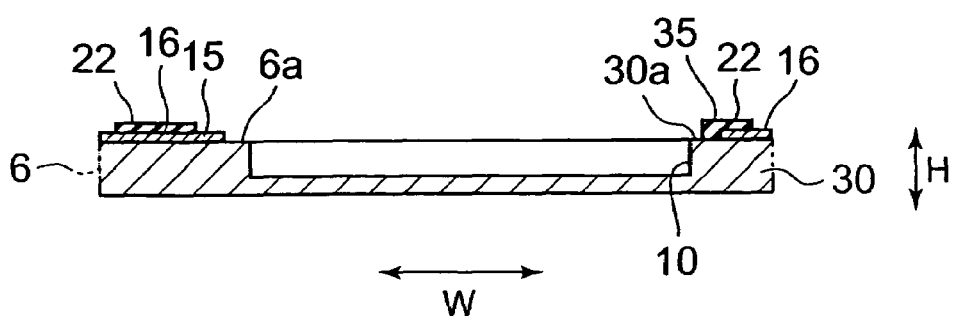
FIG. 7 is a sectional view taken along a line B-B of FIG. 6.

Further, as shown by FIG. 6 and FIG. 7, the insulting film 22 is formed (insulating film forming step). That is, the insulting film 22 is formed over an entire periphery of an edge portion of the one main face 30a including the surface of the lead-out electrode 16 by sputtering, wafer deposition, a gas phase growing method, a coating method or the like. Further, a thickness of the insulting film 22 is thicker than a thickness of the lead-out electrode 16 and is about several μm.

Figure 8:
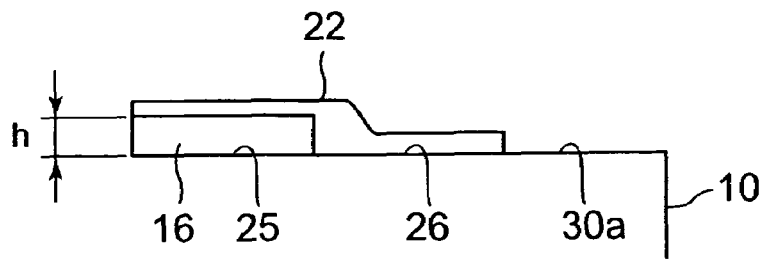
FIG. 8 is an explanatory view showing a behavior of bringing about a height difference at a surface of the insulating film in the step of forming the insulating film.
Figure 9:
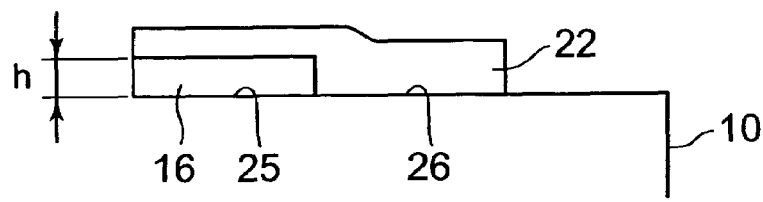
FIG. 9 is an explanatory view showing a behavior of thickly forming the insulting film at the wafer for the lid portion in the step of forming the insulting film.
Figure 10:
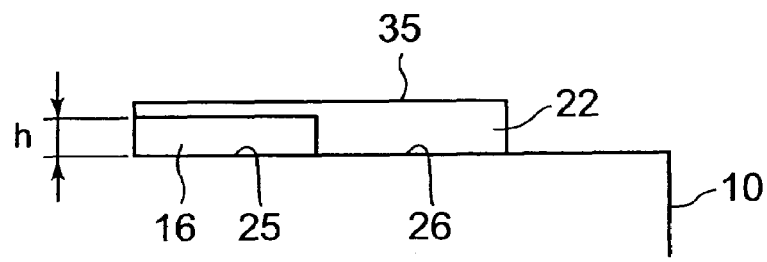
FIG. 10 is an explanatory view showing a behavior of flattening to level the surface of the insulating film of FIG. 9.

Successively, flattening of the insulting film 22 will be explained. As shown by FIG. 8, the one main face 30a is provided with the lead-out electrode 16 and therefore, there is brought about a height difference between the surface of the lead-out electrode 16 and the nonelectrode face 26 by an amount of a thickness dimension h of the lead-out electrode 16. Therefore, when the insulting film 22 is formed to be thin, the height difference is brought about at the surface of the insulating film 22. Hence, according to the embodiment, as shown by FIG. 9, first, the insulating film 22 is formed to be thick. Thereafter, the surface of the insulting film 22 is flattened by a method of, for example, etching, sputtering or the like and as shown by FIG. 10, the surface is leveled over the lead-out electrode 16 and the nonelectrode face 26. Thereby, the surface of the insulating film 22 is not provided with the height difference and becomes uniform. Further, the portion flattened at this occasion constitutes the flat portion 35 mentioned above.

Further, in accordance with the through holes 32 formed at the wafer 31 for the base, as shown by FIG. 6 four corners of the insulating film 22 are removed in the circular arc shape by patterning by photolithography. Further, similarly, also the insulating films on the surfaces of the connecting portion 15 and the lid side recess portion 10 are removed.

Figure 11:
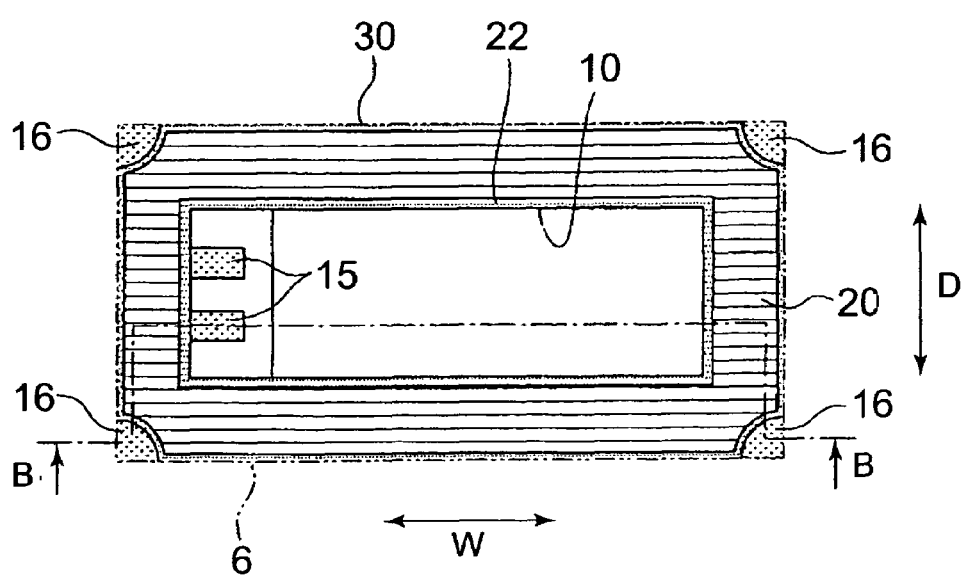
FIG. 11 is a plane view showing a behavior of forming a bonding film at the wafer for the lid portion in a step of fabricating the quartz crystal vibrator of FIG. 1.
Figure 12:
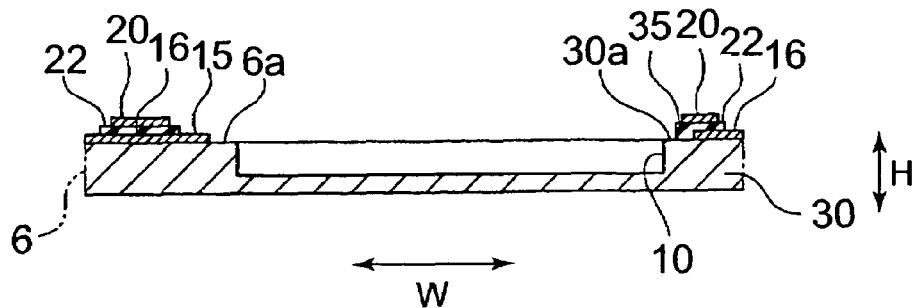
FIG. 12 is a sectional view taken along a line B-B of FIG. 11.

Thereafter, as shown by FIG. 11 and FIG. 12, the bonding film 20 is formed (bonding film forming step). That is, the bonding film 20 is formed on the insulting film 22 by sputtering or vapor deposition. Further, four corners of the bonding films 20 are removed in the circular arc shape in accordance with the insulating film 22 by patterning by photolithography. Further, similarly, also the bonding film 20 on the surfaces of the connecting portions 15 and the lid side recess portion 10 are removed.

Figure 13:
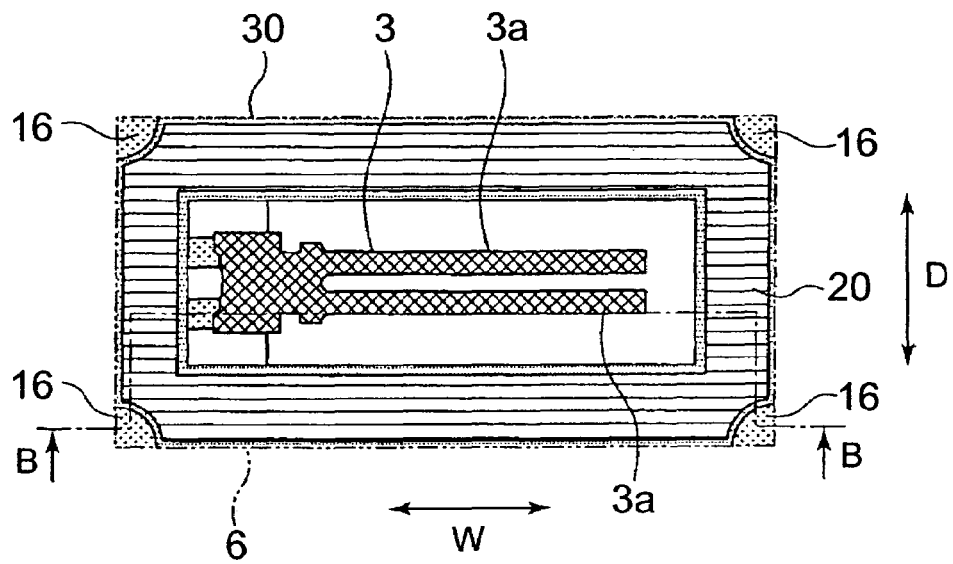
FIG. 13 is a plane view showing a behavior of providing a vibrating piece at the wafer for the lid portion in a step of fabricating the quartz crystal vibrator of FIG. 1.
Figure 14:
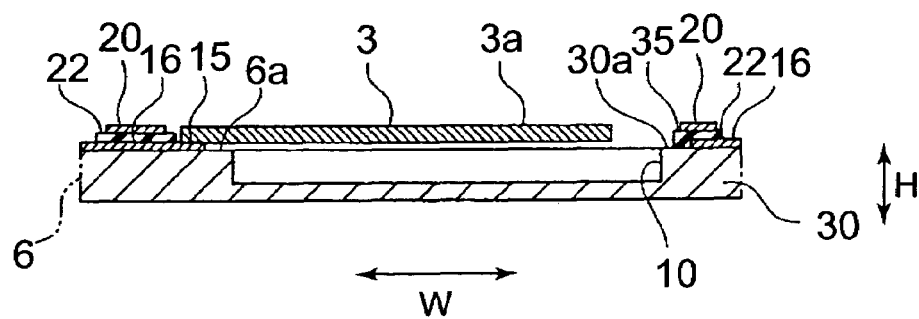
FIG. 14 is a sectional view taken along a line B-B of FIG. 13.

Further, as shown by FIG. 13 and FIG. 14, the base end portion of the quartz crystal vibrating piece 3 is electrically connected to the connecting portion 15 (connecting step). Thereby, the quartz crystal vibrating piece 3 is fixed. As the connecting method, gold-gold bonding or solder bonding utilizing ultrasonic wave, or a method of using an electrically conductive adhesive or the like can be selected.

Figure 15:
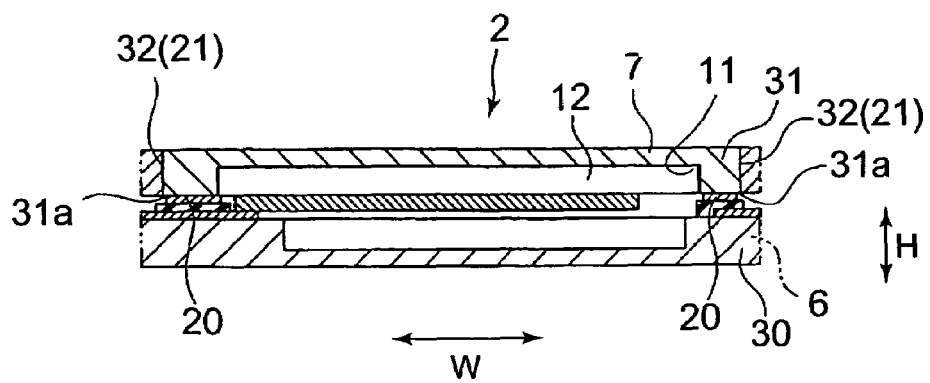
FIG. 15 is a side view showing a behavior of overlapping a wafer for a base on the wafer for the lid portion in a step of fabricating the quartz crystal vibrator of FIG. 1.

Successively, as shown by FIG. 15, the wafer 30 for the lid portion and the wafer 31 for the base are anodically bonded (bonding step). That is, in vacuum, the wafer 31 for the base is made to overlap the wafer 30 for the lid portion to cover the quartz crystal vibrating piece 3 and the like. At this occasion, the lid side recess portion 10 and the base side recess portion 11 of the respectives are opposed to each other to thereby form the cavity portion 12. Further, at this occasion, the bonding film 20 comprising, for example, silicone and the one main face 31a of the wafer 31 for the base comprising glass are brought into a state of being brought into close contact with each other.

Under the state, the wafer 30 for the lid portion and the wafer 31 for the base are heated to a predetermined temperature and are applied with a predetermined voltage. As a result, an electrostatic attraction force is produced between the bonding film 20 and the one main face 31a to be strongly brought into close contact with each other to be bonded anodically. Thereby, the cavity portions 12 are sealed in airtight to form the hermetically closed vessels 2 continuously in row and column directions. Thereafter, the voltage is stopped from being applied, the wafer 30 for the lid portion and the wafer 31 for the base are gradually cooled to return to room temperature. During a time period of elevating the temperature of the wafer 30 for the lid portion and the wafer 31 for the base to return to room temperature, the wafer 30 for the lid portion and the wafer 31 for the base are thermally expanded by elevating the temperature and contracted by being cooled gradually to recover to the original state.

Figure 17:
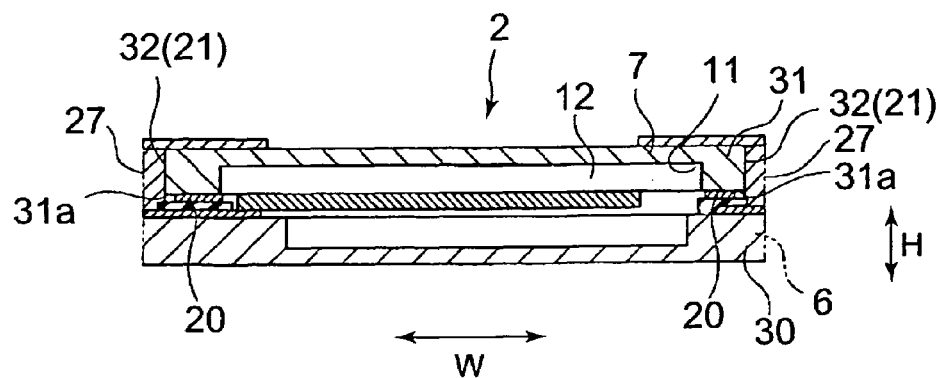
FIG. 17 is a side view showing the wafer for the lid portion and the wafer for the base of FIG. 16.

Thereafter, as shown by FIG. 16 and FIG. 17, the external terminals 27 are provided at the respective hermetically closed vessels 2 (external electrode forming step). That is, the other main face of the wafer 31 for the base is masked by a metal and is formed with a thin film by sputtering or vapor deposition. Thereby, there is provided the pair of external terminals 27 extended from inner faces of the through holes 32 to the other main face of the wafer 31 for the base. The external terminals 27 are connected to four corners of the lead-out electrodes 16 by way of the through holes 32.

Further, the wafer 30 for the lid portion and the wafer 31 for the base are cut in a dicing step. That is, the wafer 30 for the lid portion and the wafer 31 for the base after the external electrode forming step are installed at a dicing saw, and cut by a dicing blade in row and column directions on straight lines connecting the through holes 32. Thereby, the through hole 32 is divided by four and the respective divided portions constitute the external terminal connecting portion 21 in the circular arc shape as mentioned above.

Further, when the cut ones are reversed upside down, the quartz crystal vibrators 1 shown in FIG. 1 are constituted.

As described above, according to the quartz crystal vibrator 1 of the embodiment, the insulting film 22 is provided between the bonding film 20 and the lead-out electrode 16 and therefore, the bonding film 20 and the lead-out electrode 16 are insulated from each other and are not interfered with each other. Therefore, the lead-out electrode 16 and the bonding film 20 can be prevented from being electrically conducted to each other. Further, by dividing the through hole 32, the external terminal connecting portion 21 is formed, the external terminal 27 is connected to the lead-out electrode 16 from the side face of the hermetically closed vessel 2 by way of the external terminal connecting portion 21 and therefore, the through hole 32 can be prevented from being left on the other main face of the base member 7. Therefore, the outer air does not invade from the clearance of the through hole.

Therefore, the plurality of electrodes for applying the voltage to the quartz crystal vibrating piece 3 can easily be provided while maintaining airtightness at inside of the hermetically closed vessel 2 over a long period of time.

Further, since the lid member 6 and the base member 7 comprise the same member of glass, thermal expansion coefficients of the lid member 6 and the base member 7 can be matched. Therefore, in the bonding step, amounts of deformation in thermal expansion and contraction can be matched, and the lid member 6 and the base member 7 can firmly be bonded with excellent accuracy.

Further, since the insulating film 22 is provided over the lead-out electrode 16 and the nonelectrode face 26 and the surface 22a of the insulating film 22 is provided with the flat portion 35, the surface 22a can uniformly be leveled by absorbing a stepped difference between the lead-out electrode 16 and the nonelectrode face 26, and the lid member 6 and the base member 7 can firmly be bonded with further excellent accuracy.

Embodiment 2

Next, a second embodiment of the invention will be explained.

FIG. 18 through FIG. 21 show a second embodiment of the invention.

In FIG. 18 through FIG. 21, portions the same as constituent elements illustrated in FIG. 1 through FIG. 17 are attached with the same notations and an explanation thereof will be omitted.

Basic constitutions of the embodiment and the first embodiment are the same, and an explanation will be given here only of a point of difference.

Figure 18:
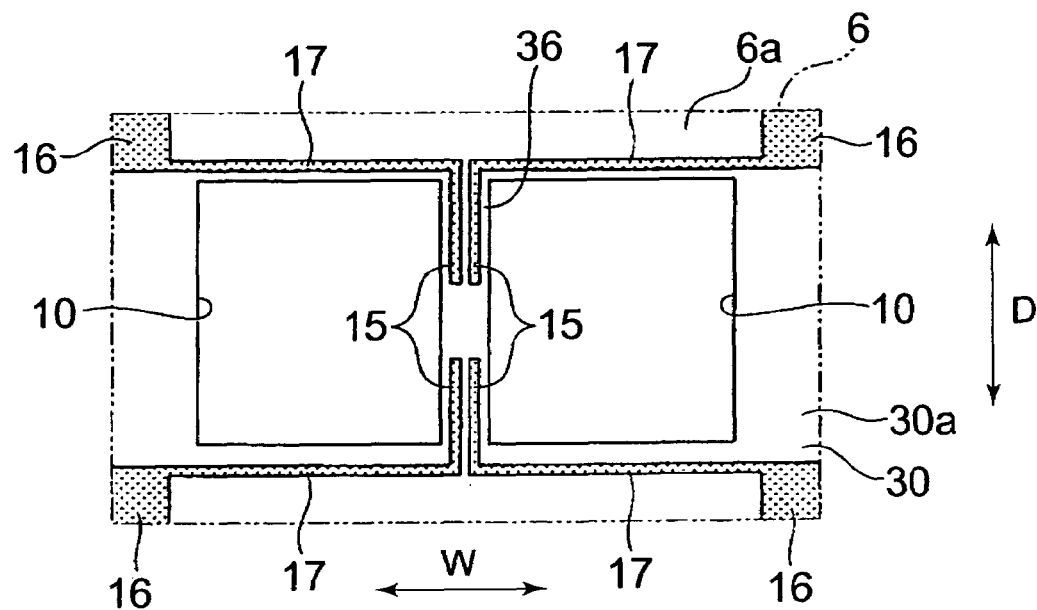
FIG. 18 is a plane view showing a behavior of forming a lead-out electrode at a wafer for a lid portion in a step of fabricating a quartz crystal vibrator according to a second embodiment of the invention.
Figure 19:
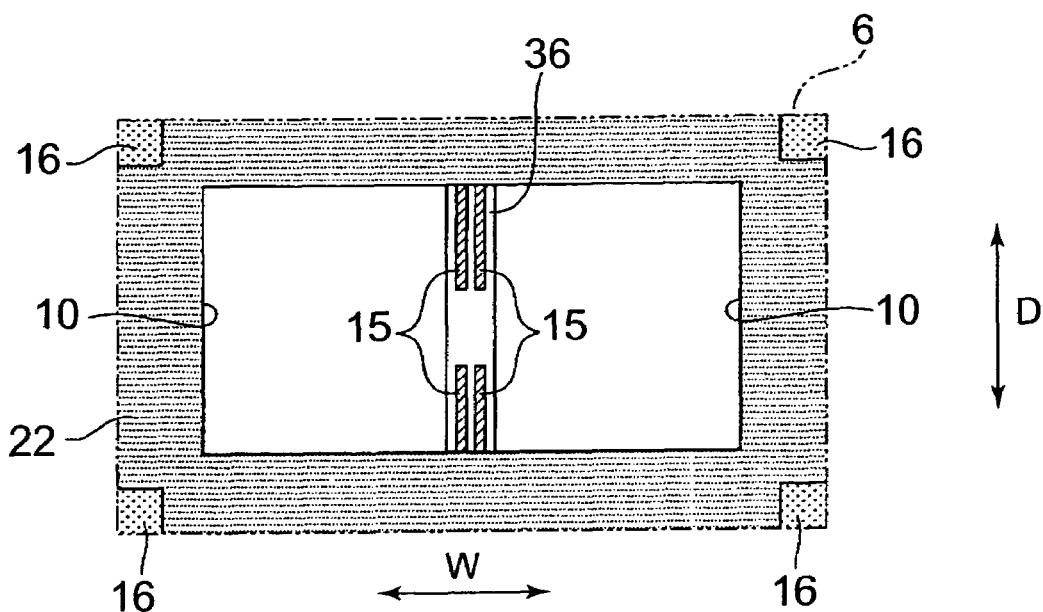
FIG. 19 is a plane view showing a behavior of forming an insulating film at the wafer for the lid portion of FIG. 18.
Figure 20:
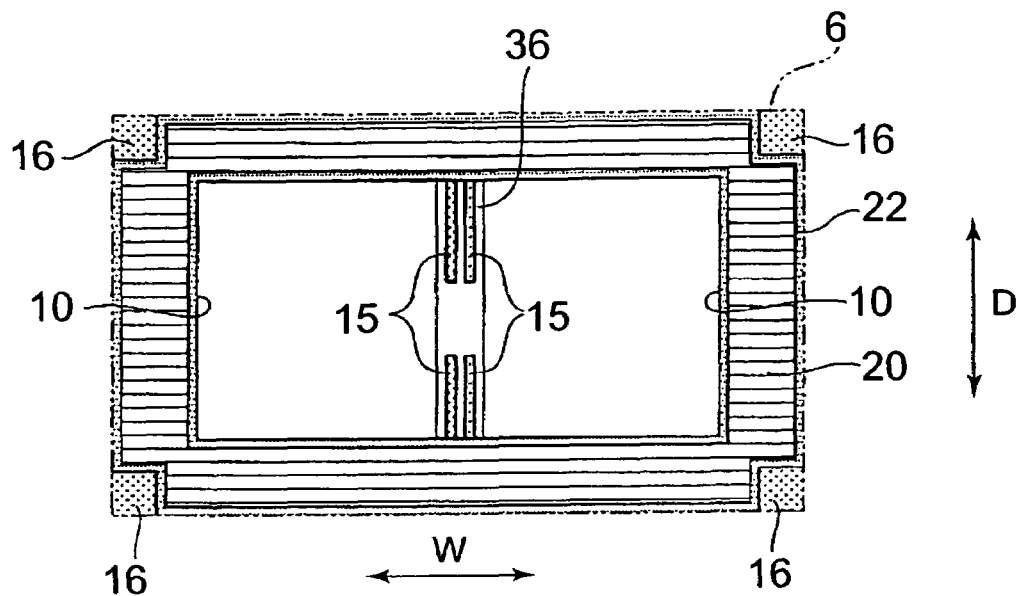
FIG. 20 is a plane view showing a behavior of forming a bonding film at the wafer for the lid portion of FIG. 19.

According to the embodiment, as shown by FIG. 18, the lid side recess portion 10 is partitioned in two in the width direction W, and a partitioning portion 36 for partitioning the lid side recess portion 10 is provided with two pairs of the connecting portions 15. Further, the partitioning portion 36 constitutes the one main face 6a of the lid member 6. Further, the respective connecting portions 15 are extended to four corners of the one main face 6a by way of the lead-out portions 17. Further, the connecting portions 15 are provided with an angular velocity sensor (piezoelectric vibrating piece) 37 shown in FIG. 21.

When quartz is used as a piezoelectric element of the angular velocity sensor 37, there is provided an electric property which is highly stable also against a change in an environmental temperature. The angular velocity sensor 37 is constituted by a structure having a base portion 37b at a center in a length direction thereof, including a pair of vibrating arms 37a for vibration extended in one direction from the base portion 37b, and including a pair of vibrating arms 37a for detection opposed to the pair of vibration arms 37a and extended to a side opposed thereto from the base portion 37b, and an outlook thereof constitutes an H-like shape in view from a plane. A concise description will be given of a principle of operating the angular velocity sensor (piezoelectric type vibration gyro) 37 of the H-like shape as follows.

The vibrating arms 37a for vibration are formed with exciting electrodes (not illustrated), which generate an electric field in the depth direction D when applied with a predetermined alternating current voltage and the pair of vibrating arms 37a for vibration carries out flexural movement. Under the state, when a rotational angular velocity (X is operated around an axis extended in the width direction W, Coriolis force in accordance with the rotational angular velocity ω is operated in a direction orthogonal to a vibrating direction, and the vibration arms 37a are vibrated in the height direction H. The vibration is transmitted to the vibrating arms 37a for detection by way of the base portion 37b, and also the pair of vibrating arms 37a for detection are vibrated by a resonance frequency. The vibrating arms 37*a* for detection are provided with electrode pads (not illustrated) for detecting vibration at side faces thereof for detecting an electric signal of an alternating current voltage generated in accordance with compressive and tensile deformations of the vibration arm portions 37*a* for detection. By outputting the detected electric signal to a circuit (not illustrated) at outside of the package and processing the signal, the rotational angular velocity ω and a rotational direction thereof can be known.

Four pieces of external terminals are needed for connecting the electric signal between the detecting element and the external circuit. That is, there are a total of 4 pieces of a pair of external terminals for applying the alternating current voltage on the vibrating arms 37*a* for vibration and a pair of external terminals connected to the electrode pads of the vibrating arms 37*a* for detection for outputting a detecting signal. The above-described two pairs of connecting portions 15 are connected to the total of 4 pieces of external terminals.

Or, although not illustrated, there can also be constructed a constitution of arranging a semiconductor integrated circuit at inside of the hermetically closed vessel and carrying out a signal processing. In this case, the detecting element is electrically connected to the semiconductor integrated circuit. In connecting the semiconductor integrated circuit and a circuit at outside of the hermetically closed vessel 2, for example, the connection is constituted by 5 pieces of "VDD (direct current voltage)", "GND", "VOUT", "VREF", "START".

Figure 21:
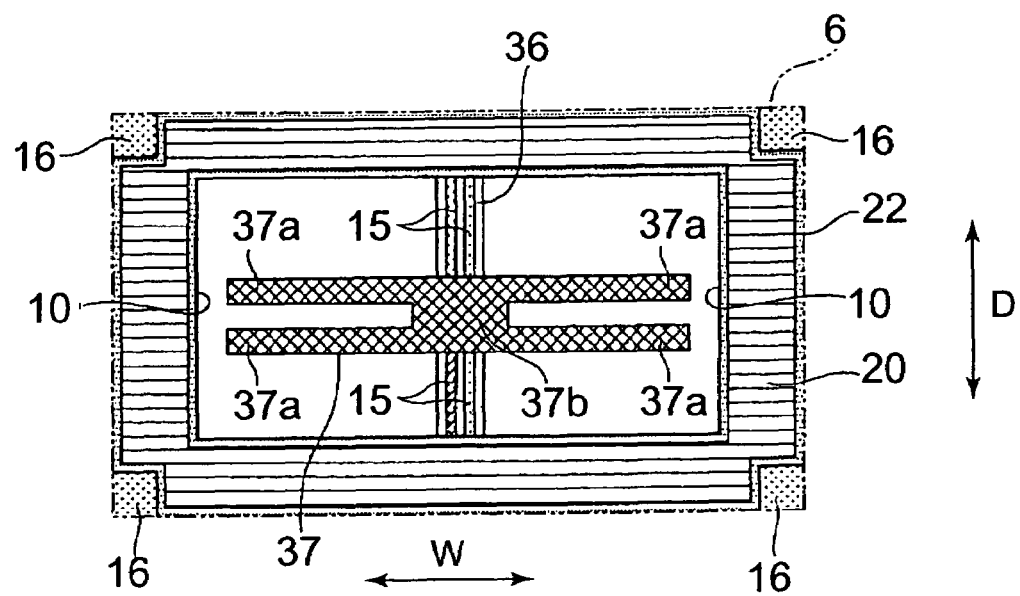
FIG. 21 is a plane view showing a behavior of providing an angular velocity sensor at the wafer for the lid portion of FIG. 20.

The quartz crystal vibrator 1 is fabricated as follows. That is, as shown by FIG. 18, the one main face 30*a* of the wafer 30 for the lid portion is formed with the lid side recess portion 10 partitioned into two by way of the partitioning portion 36. Further, in the electrode forming step, the portioning portion 36 is formed with the two pairs of connecting portions 15, and the one main face 30*a* is formed with the lead-out electrodes 16 extended to four corners. Thereafter, after having been processed by the insulating film forming step and the bonding film forming step shown in FIG. 19 and FIG. 20, as shown by FIG. 21, in the connecting step, the angular velocity sensor 37 in the H-like shape is electrically connected to the connecting portions 15. Further, the quartz crystal vibrator 1 is fabricated similar to the above-described.

In this way, also in the angular velocity sensor 37 needing 4 or more pieces of the external terminals, the electrode can be led out to outside easily by the invention. Therefore, a reduction in a mechanical strength of the base member 7 can be restrained in comparison with the method of the related art in which a number of pieces of through holes are provided at a bottom face of the base member 7. Therefore, the angular velocity sensor 37 can stably be operated over a long period of time.

Further, although in the first and the second embodiments, the connecting portion 15 and the lead-out electrode 16 comprise the electrically conductive member of, for example, Cr, Ti or the like, the invention is not limited thereto but the member can pertinently be changed. In this case, it is preferable that the electrically conductive member is constituted by a material which is easy to be bonded to the lid member 6.

Further, also members of the insulating film 22 and the bonding film 20 can pertinently be changed.

Further, although a plurality of the quartz crystal vibrators 1 are summarizingly fabricated by the wafer 30 for the lid portion and the wafer 31 for the base, the invention is not limited thereto but the quartz crystal vibrators may individually be fabricated.

Further, although the piezoelectric vibrating piece is constituted by the quartz crystal vibrating piece 3 comprising quartz, the invention is not limited thereto but the piezoelectric vibrating piece may be constituted by a vibrating piece comprising various piezoelectric single crystal materials of lithium niobate and the like.

Further, although the angular velocity sensor 37 is provided, the invention is not limited thereto but vibrating pieces for various sensors for measuring other physical amounts, a thickness share vibrating piece (AT cut, BT cut) or a vibrating piece of other cut angle will do. Further, also a surface acoustic wave element will do.

Further, although etching, sputtering or the like is carried out as means for flattening, the invention is not limited thereto but the flattening means may be other means of, for example, polishing or the like.

Figure 22:
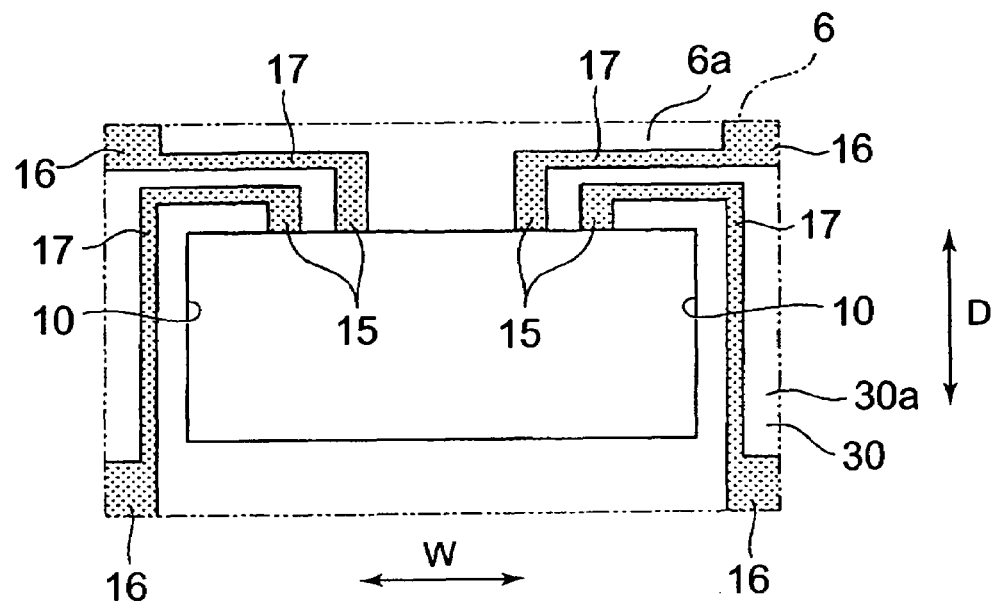
FIG. 22 is a plane view showing a modified example of the lead-out electrode.
Figure 23:
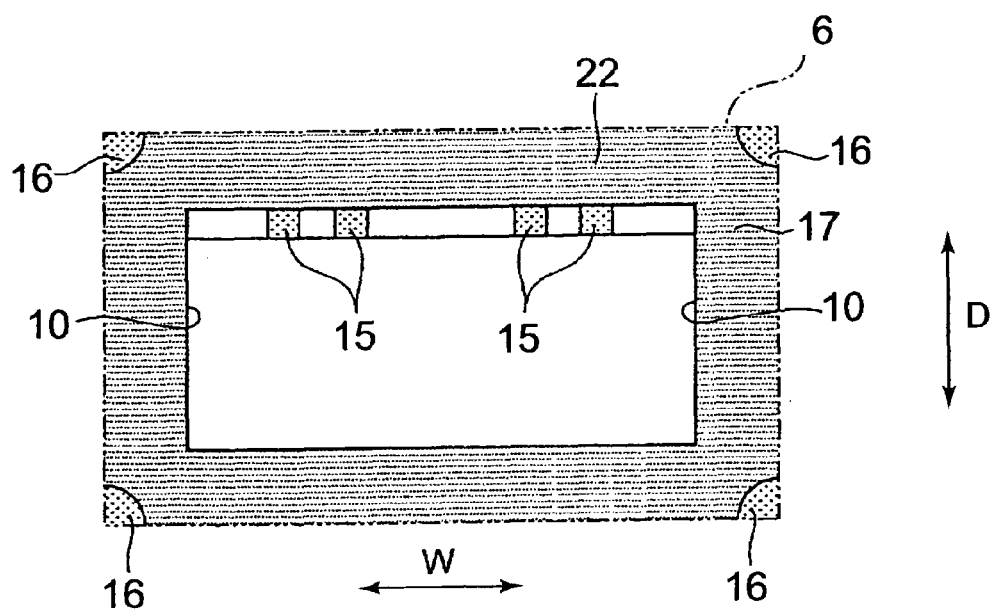
FIG. 23 is a plane view showing a behavior of forming an insulting film at the wafer for the lid portion of FIG. 22.
Figure 24:
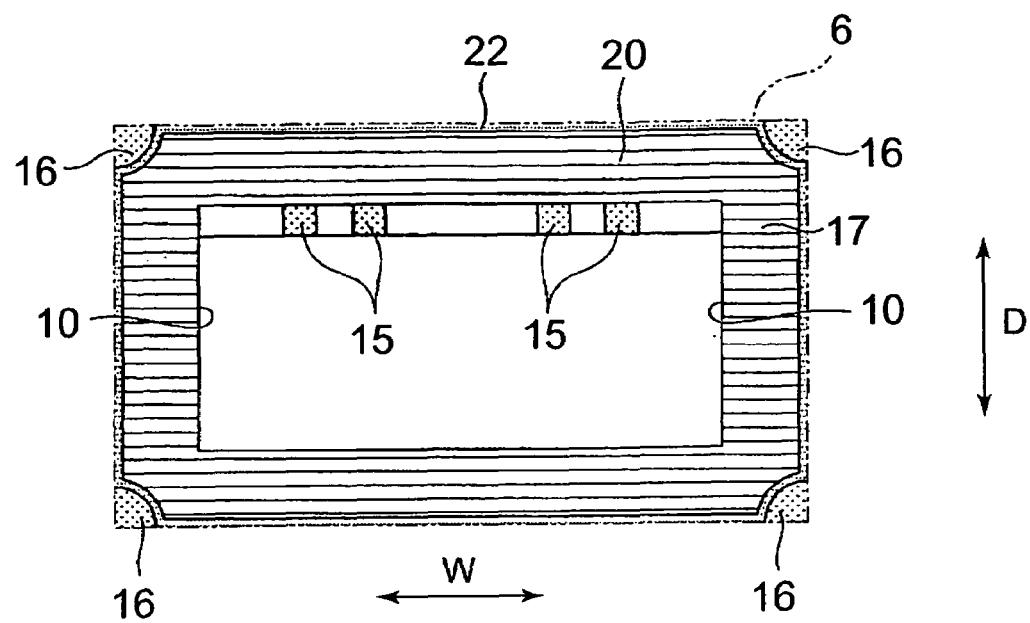
FIG. 24 is a plane view showing a behavior of forming a bonding film at the wafer for the lid portion of FIG. 23.
Figure 25:
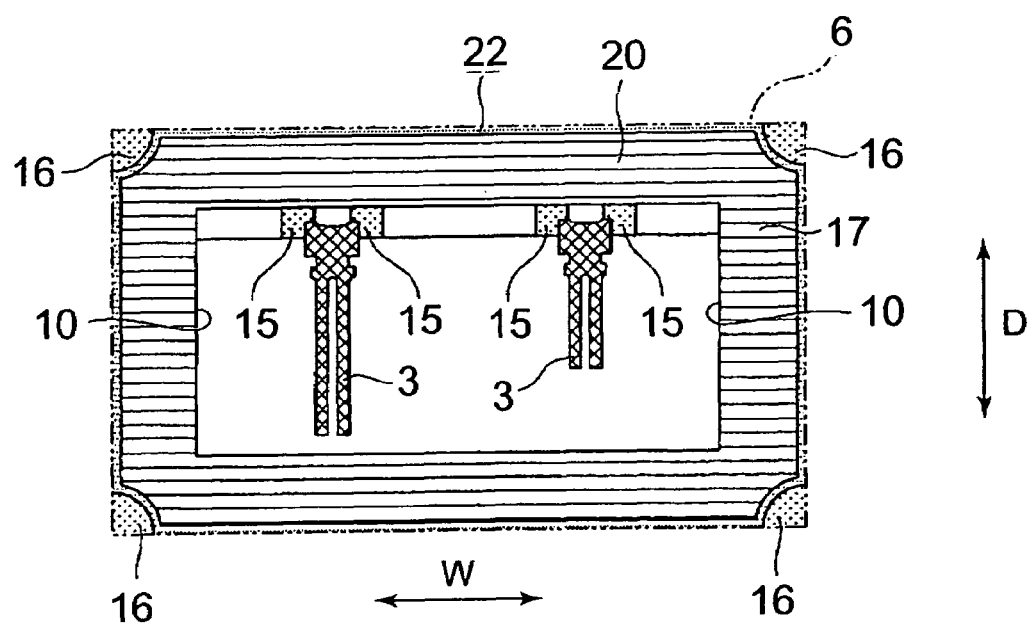
FIG. 25 is a plane view showing a behavior of providing a plurality of quartz crystal vibrating pieces at the wafer for the lid portion of FIG. 24.

Further, a pattern of the lead-out electrode 16 and a number of installing the connecting portions 15 can pertinently be changed. For example, as shown by FIG. 22, two pairs of the connecting portions 15 can be aligned in the width direction W at an edge portion of a long side of the base side recess portion 11. Further, after having been processed by the insulting film forming step and the bonding film forming step shown in FIG. 23 and FIG. 24, as shown by FIG. 25, in the connecting step, the quartz crystal vibrating pieces 3 are respectively connected electrically to the pairs of connecting portions 15. That is, two of the quartz crystal vibrating pieces 3 are provided. Further, a number of installing the quartz crystal vibrating pieces 3 may be two or more and the number of installation can pertinently be changed.

Embodiment 3

Figure 26:
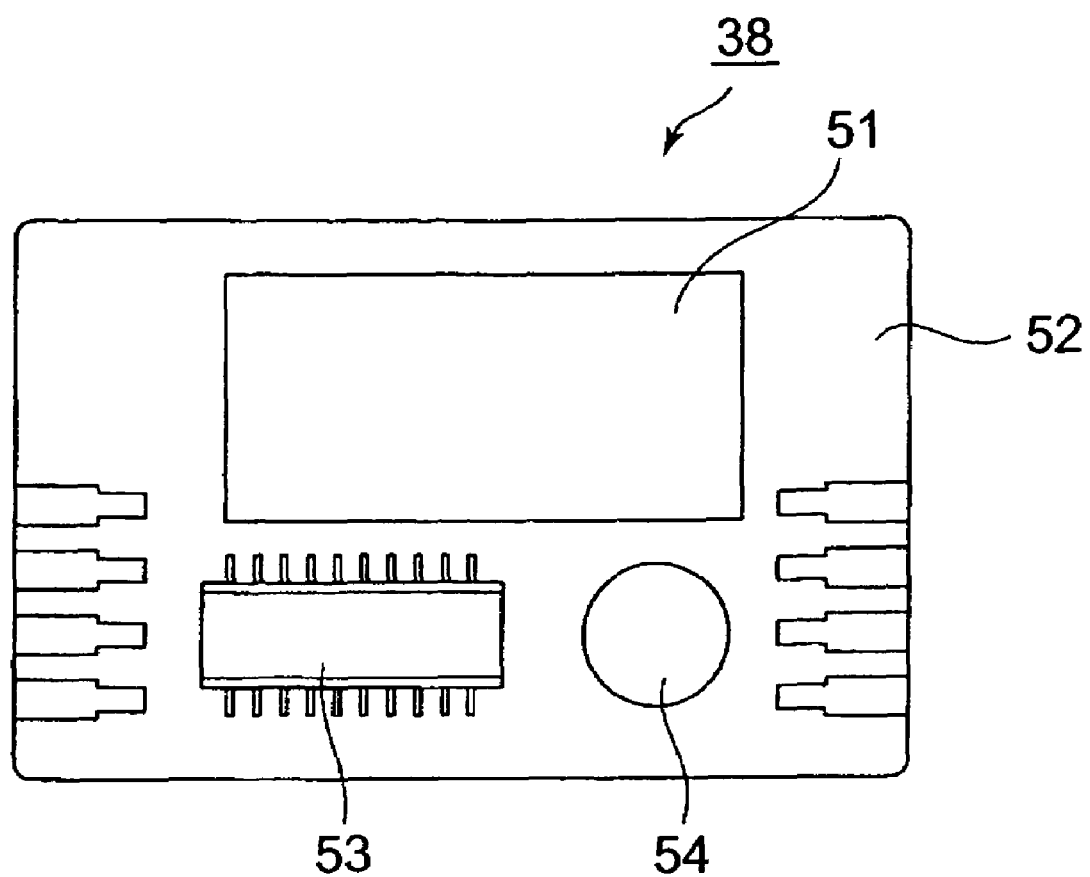
FIG. 26 is a plane view showing an oscillator according to a third embodiment of the invention.

As a third embodiment of the present invention, an oscillator in which the above-mentioned piezoelectric vibrator is connected to an integrated circuit as an oscillation piece is explained in conjunction with FIG. 26.

FIG. 26 is a rough schematic view showing the constitution of a tuning-fork-type quartz crystal oscillator 38.

In FIG. 26, the tuning-fork-type quartz crystal vibrator 1 is set at a given position on a board 40, while an integrated circuit for oscillator indicated by numeral 43 is arranged close to the quartz crystal vibrator. Further, an electronic component 39 such as a capacitor is also mounted on the board 40. These respective parts are electrically connected with each other through a wiring pattern not shown in the drawing. The mechanical vibrations of a piezoelectric vibrator piece of the tuning-fork-type quartz crystal vibrator 1 are converted into electric signals due to the piezoelectric characteristic which the quartz crystal possesses and the electric signals are inputted to the integrated circuit 43. In the inside of the integrated circuit 43, the signal processing is performed and frequency signals are outputted and hence, the integrated circuit 43 functions as an oscillator. These respective constitutional parts are molded by resin not shown in the drawing. By selecting, for example, a RTC (Real Time Clock) module or the like as the integrated circuit 43, the integrated circuit 43 also has, besides a function of a single function oscillator for clock, a function of controlling an operation day and time of the oscillator and an external apparatus and a function of providing information on time and calendar to a user.

In the oscillator according to the invention, an effect similar to that of the above-described piezoelectric vibrator can be achieved. Therefore, the oscillator can be functioned with stable accuracy over a long period of time.

Embodiment 4

Figure 27:
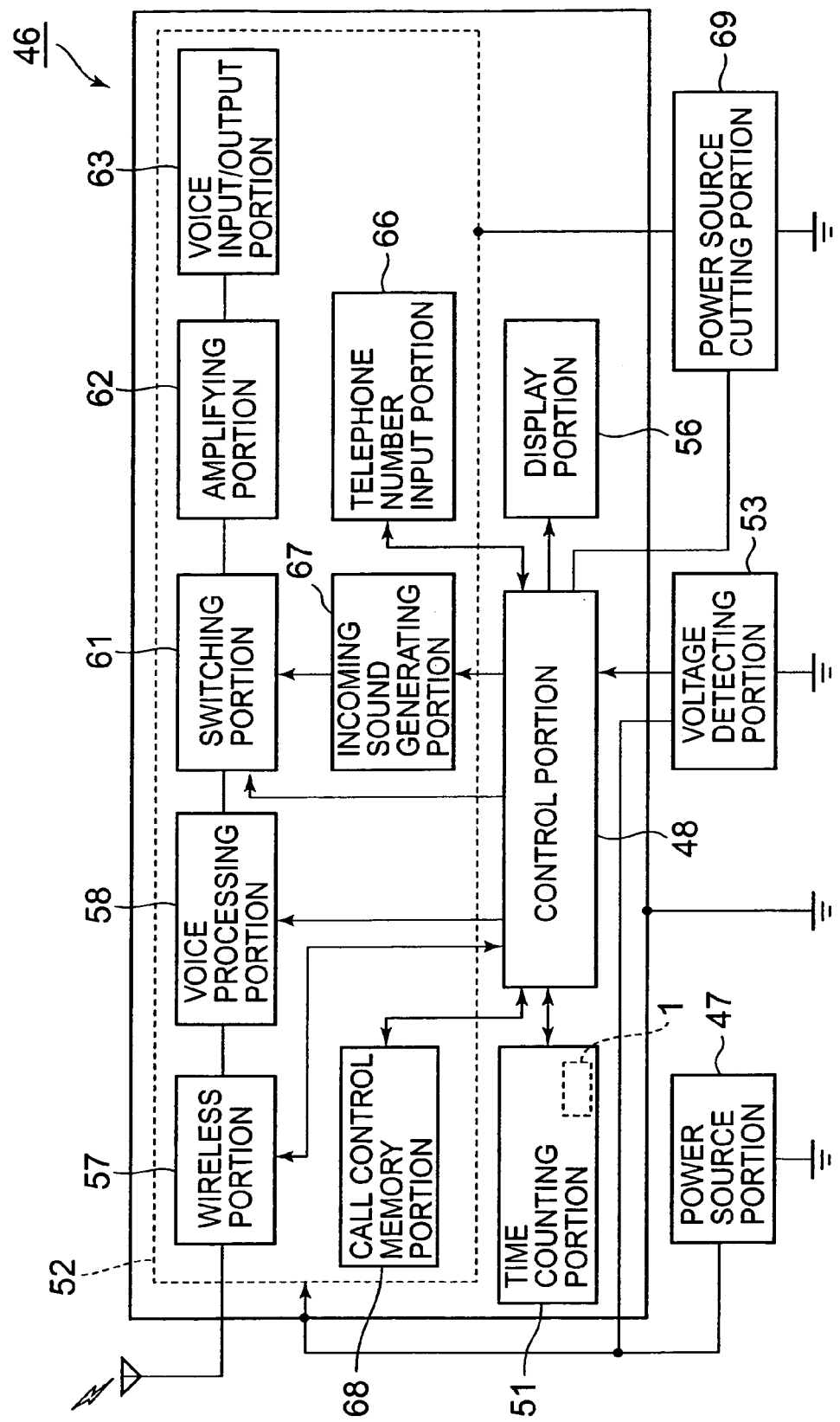
FIG. 27 is a block diagram showing a portable information apparatus according to a fourth embodiment of the invention.

As a fourth embodiment of the present invention, an electronic apparatus used in a state that the above-mentioned piezoelectric vibrator is connected to a time counting portion is explained in conjunction with FIG. 27. As an example of the electronic apparatus, a preferred embodiment on a portable information apparatus represented by a mobile phone is explained in detail.

First of all, as a premise, the portable information apparatus according to this embodiment is a development or an improvement of a wrist watch of the related art. The portable information apparatus resembles the wrist watch in appearance, arranges a liquid crystal display on a portion thereof which corresponds to a dial plate, and can display a current time and the like on a screen of the display. In using the portable information apparatus as a communication device, the portable information apparatus is removed from a wrist and a user can perform the communication in the same manner as a mobile phone of the related art using a speaker or a microphone incorporated in the inside of a band portion. However, the portable information apparatus is drastically miniaturized and is light-weighted compared to the conventional mobile phone.

Next, the functional constitution of the portable information apparatus according to this embodiment is explained in conjunction with the drawing. FIG. 27 is a block diagram showing the constitution of the portable information apparatus 46 according to this embodiment functionally.

In FIG. 27, numeral 47 indicates a power source portion which supplies electricity to respective functional parts described later. To be more specific, the power source portion 47 is embodied by a lithium ion secondary cell. To the power source portion 47, a control portion 48, a time counting portion 51, a communication portion 52, a voltage detecting portion 53 and a display portion 56 are connected in parallel to each other, wherein the electricity is supplied to the respective functional parts from the power source portion 47.

The control portion 48 controls the respective functional parts described later and performs an operational control of the whole system such as the transmission and reception of vocal data, the measurement and display of the current time and the like. The control portion 48, to be more specific, is embodied by programs which are preliminarily written in a ROM, a CPU which reads out and executes the programs, a RAM which is used as a work area of the CPU and the like.

A time counting portion 51 is constituted of an integrated circuit which incorporates an oscillation circuit, a register circuit, a counter circuit, an interface circuit and the like therein and the tuning-fork-type quartz crystal vibrator which is described in the embodiment 1 or 2. The mechanical vibrations of the tuning-fork-type quartz crystal vibrator are converted into electric signals due to the piezoelectric characteristic which the quartz crystal possesses and the electric signals are inputted to the oscillation circuit which is constituted of a transistor and a capacitor. An output of the oscillation circuit is binarized and the binarized value is counted by the register circuit and the counter circuit. The transmission and reception of signals are performed between the time counting portion 51 and the control portion 48 through the interface circuit and the current time, the current date or the calendar information is displayed on the display portion 56.

The communication portion 52 functions in the same manner as the mobile phone of the related art and is constituted of a wireless portion 57, a voice processing portion 58, an amplifying portion 62, a voice input/output portion 63, an incoming sound generating portion 67, a switching portion 61, a call control memory portion 68 and a telephone number input portion 66.

The wireless portion 57 transmits and receives various kinds of data such as vocal data with a base station via an antenna. The voice processing portion 58 codes and decodes the vocal signal inputted from the wireless portion 57 or the amplifying portion 62 described later. The amplifying portion 62 amplifies the signal inputted from the voice processing portion 58 or the voice input/output portion 63 described later to a given level. The voice input/output portion 63 is, to be more specific, a speaker or a microphone and amplifies an incoming call sound or a phone sound or collects a speaker's voice.

The incoming sound generating portion 67 generates an incoming call sound in response to calling from the base station. The switching portion 61 changes over the connection between the amplifying portion 62 and the voice processing portion 58 to the connection between the amplifying portion 62 and the incoming call generating portion 67 only at the time of receiving the incoming signal and hence, the generated incoming call sound is outputted to the input/output portion 63 through the amplifying portion 62.

Here, the calling control memory 68 stores a program related to the outgoing/incoming calling control of the communication. Further, the telephone number input portion 66, to be more specific, is constituted of number keys from 0 to 9 and some other keys and is served for inputting the telephone number of a telephone call destination or the like.

The voltage detecting portion 53, when a voltage applied to the respective functional parts including the control portion 48 from the power source portion 47 becomes lower than a given value, detects the lowering of the voltage and notifies the lowering of the voltage to the control portion 48. The given voltage value is a value which is preliminarily set as a minimum voltage for operating the communication portion 52 in a stable manner and is a voltage of approximately 3V, for example. The control portion 48, upon receiving the notification of lowering of the voltage from the voltage detecting portion 53, inhibits the operations of the wireless portion 57, the voice processing portion 58, the switching portion 61 and the incoming sound generating portion 67. Particularly, the stopping of the operation of the wireless portion 57 which exhibits the large power consumption is indispensable. Simultaneously with such stopping of the operations, a message that the communication portion 52 is inoperable due to the shortage of the remaining battery amount is displayed on the display portion 56.

Due to the cooperative operation of the voltage detecting portion 53 and the control portion 48, it is possible to inhibit the operation of the communication portion 52 and it is also possible to display the inhibition of the operation of the communication portion 52 on the display portion 56.

In this embodiment, by providing a power source cutting portion 69 which can selectively interrupt the power supply of a portion corresponding to the function of the communication portion, it is possible to stop the function of the communication portion in a more complete form.

Here, although the display of the message that the communication portion 52 becomes inoperable may be performed using a letter message, the display may be performed by more instinctive methods including a method in which a mark "x" (meaning inoperable) is applied to a telephone icon on the display portion 56.

In the electric apparatus according to the invention, an effect similar to that of the above-described piezoelectric vibrator can be achieved. Therefore, the electric apparatus can be reliable and functioned with stable accuracy over a long period of time.

Embodiment 5

Figure 28:
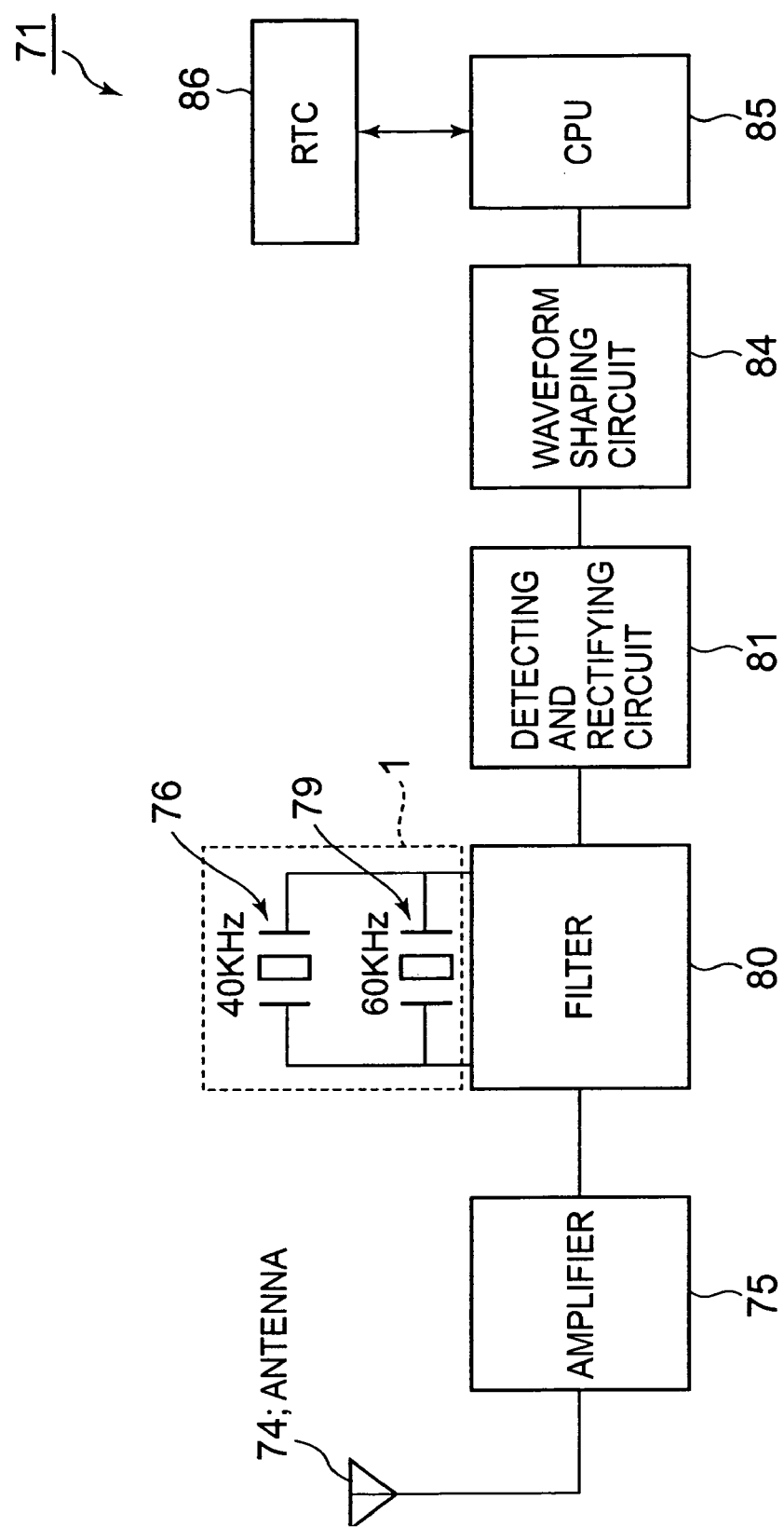
FIG. 28 is a block diagram showing a radio wave timepiece according to a fifth embodiment of the invention.

FIG. 28 is a schematic view showing a circuit block of a radio wave timepiece 71 which constitutes an electronic apparatus according to a fifth embodiment of the present invention. The embodiment shows a case in which the tuning-fork-type quartz crystal vibrator (piezoelectric vibrator) manufactured by the manufacturing method of the present invention is connected to a filter part of the radio wave timepiece 71.

The radio wave timepiece 71 is a clock which has a function of receiving the standard electric wave containing time information and displaying the time information by automatically correcting the time to an accurate time. In Japan, transmission stations (transmitting facilities) which transmit the standard electric waves are located in Fukushima prefecture (40 KHz) and Saga prefecture (60 KHz) and these transmission stations transmit the standard electric waves respectively. Long waves having frequency of 40 KHz or 60 KHz have a property that the long waves are propagated on a surface of the earth and a property that the long waves are propagated while being reflected between an ionosphere and the surface of the earth and hence, the propagation range is broad whereby the long waves cover the whole Japan with the above-mentioned two transmission stations.

In FIG. 28, an antenna 74 receives the standard electric waves formed of the long waves of 40 KHz or 60 KHz. The standard electric waves formed of long waves are electric waves obtained by applying the time information referred to as a time code to the carrier wave of 40 KHz or 60 KHz using the AM modulation.

The received standard electric waves formed of long waves are amplified by an amplifier 75. Subsequently, the standard electric waves are filtered by a filter part 80 containing quartz crystal vibrators 76, 79 having the same resonance frequency as the carrier wave frequency and are synchronized with the carrier wave. The filtered signal of given frequency is detected and demodulated by a detecting/rectifying circuit 81. Then, the time code is taken out through a waveform shaping circuit 84 and is counted by a CPU 85. The CPU 85 reads out the information such as the current year, the accumulated days, date, time and the like. The read-out information is reflected on a RTC 86 and the accurate time information is displayed.

Since the carrier wave is 40 KHz or 60 KHz, it is preferable to use the above-mentioned vibrator having the tuning-fork-type structure as the quartz crystal vibrators 76, 79 which constitute the filter parts respectively. Taking the long waves of 60 KHz, for example, as a size example of the tuning-fork-type vibrator, it is possible to configure the vibrating piece such that the vibrating piece has a total length of approximately 2.8 mm and a width size of a base portion thereof is approximately 0.5 mm.

Although the above-described explanation has been given by the example in Japan, the frequency of the standard radio wave of the long wave differs abroad. For example, in Germany, a standard radio wave of 77.5 KHz is used. Therefore, when a portable apparatus is integrated with a radio wave timepiece capable of corresponding to abroad, a quartz crystal vibrator having a frequency which differs from that of the case of Japan is further needed. According to the invention, it is easy to install the lead-out electrode and the vibrating piece other than the vibrating pieces of 40 KHz, 60 KHz can further be integrated to inside of one package. Further, a method of mounting two or more of the quartz crystal vibrating pieces is not limited thereto but the quartz crystal vibrating pieces can also be formed by extending a plurality of vibrating arms from a common base portion.

As described above, the radio wave timepiece 71 containing a plurality of vibrating pieces in one package is constituted by using the invention and therefore, the mounting area can considerably be reduced in comparison with mounting a plurality of vibrators contained in individual vessels. Further, the external electrode is formed by restraining the reduction in the mechanical strength of the base member and therefore, the radio wave timepiece can be functioned with stable accuracy over a long period of time.

Embodiment 6

Next, a sixth embodiment of the invention will be explained.

In FIGS. 29A and 29B, notation 100 designates an electronic part.

The electronic part 100 includes a hermetically closed vessel 102 formed substantially in a rectangular shape and a device 103 provided at inside of the hermetically closed vessel 102.

The device 103 is used at inside of the hermetically sealed vessel 102 and therefore, a device preferably used in high vacuum, or a device preferably used in an inert gas is mainly selected as in an ultraviolet ray sensor, an inertia sensor of an acceleration sensor or a gyro sensor, or an RF-MEMS resonator.

The hermetically sealed vessel 102 is constituted by overlapping a base member 106 in a plate-like shape and a lid member 107 substantially in a plate-like shape each other in thickness directions thereof and bonding the base member 106 and the lid member 107 by anodic bonding.

The base member 106 and the lid member 107 are made of, for example, glass or silicone. Further, a rectangular recess portion 108 is formed at a center portion of a face of the lid member 107 opposed to the base member 106. Further, the lid member 107 and the base member 106 are overlapped and bonded in a state of making a lower face of the lid member 107 and an upper face of the base member 106 opposed to each other. A cavity portion 109 is formed at inside of the hermetically closed vessel 102 and the device 103 is contained at inside of the cavity portion 109 by interposing more or less clearance between the device 103 and the lid member 107 or the like such that, for example, vibration thereof is permitted. Inside of the hermetically closed vessel 102 is sealed in airtight and the cavity portion 109 is maintained in a vacuum state.

Also as shown by FIGS. 31A and 31B, an upper face 106a (face overlapped with the lid member) of the base member 106 is arranged with a plurality of lead-out electrodes 110. The lead-out electrode 110 includes an inner side connecting portion 110a electrically connected to the device 103, an outer side connecting portion 110b provided at an edge portion of one overlapping face, and a wiring portion 110c for electrically connecting the inner side connecting portion 110a and the outer side connecting portion 110b.

As shown by, for example, FIG. 31A, the inner side connecting portions 110a of the lead-out electrodes 110 are formed in a shape of a checker board. The inner side connecting portions 110 are formed to correspond to electric connecting portions (not illustrated) of the device 103. Further, the outer side connecting portions 110b are arranged at an outer peripheral portions of the upper face 106a of the base 106 to be spaced apart from each other at intervals therebetween. Further, the inner side connecting portions 110a and the outer side connecting portions 110b are electrically connected by the wiring portions 110c by making the connecting portions constituting pairs individually independent. Further, the lead-out electrodes 110 are fabricated by electrically conductive members of, for example, Cr, Ti or the like.

Also as shown by FIGS. 32A and 32B, the upper face 106a of the base member 106 is provided with an insulating film 112 comprising, for example, $SiO_2$, $Si_3N_4$ to cover a plurality of the lead-out electrodes 110.

As shown by FIG. 32, the insulating film 112 is provided to be continuous over an entire periphery by substantially the same width dimension at a portion of the upper face 106a disposed on an inner side from an outer end of an edge portion thereof by a predetermined distance to cover only the wiring portions 110c without covering the inner side connecting portions 110a and the outer side connecting portions 110b. An upper face (face opposed to an overlapping face of the lid member 107) 112a of the insulating film 112 is formed with a flattening portion 113 leveled in a flat shape by being flattened. The insulating film 112 achieves a function of leveling a recessed and protruded portion which is liable to be brought about due to the lead-out electrodes 110 provided at the upper face 106a constituting a face of the base member 106 for overlapping with the lid member in a flat shape and therefore, a thickness M1 of the insulating film 112 is set to be larger than a thickness M2 of the lead-out electrode 110.

Figure 33B:
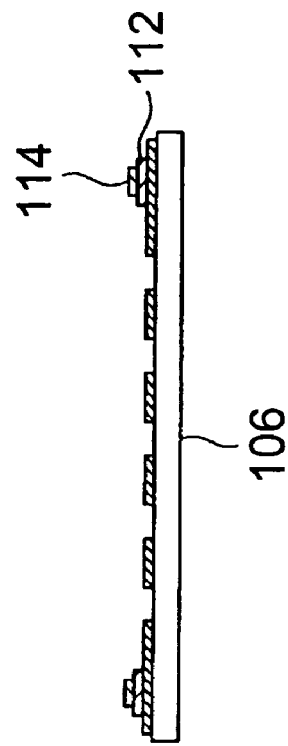
FIGS. 33A and 33B illustrate views showing a step of the method of fabricating the electronic part according to the sixth embodiment of the invention.
Figure 33A:
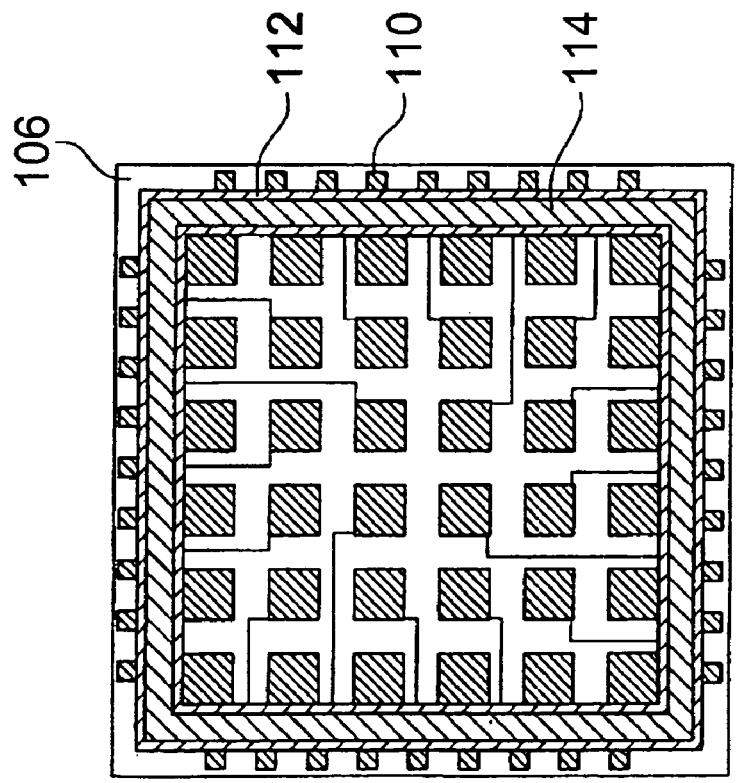

Further, also as shown by FIGS. 33A and 33B, a further upper face of the insulating film 112 is provided with a bonding film 114 comprising, for example, a metal of Cr or the like or silicone. The bonding film 114 is for bonding the lid member 107 and the lid member 107 is bonded to the base member 106 by way of the bonding film 114. A width dimension of the bonding film 114 is set to be the same as or more or less smaller than a width dimension of the insulating film 112.

Under such a constitution, when a predetermined voltage is applied to a predetermined one of the outer side connecting portion 110b connected to a power source in the plurality of outer side connecting portions 110b, the voltage is applied to the device 103 by way of the wiring portion 110c and the inner side connecting portion 110a. Then, predetermined operation is carried out at inside of the device 103 and an output signal is generated. The output signal is outputted to a predetermined one of the outer side connecting portion 110b from an output side connecting portion (output terminal) of the device 103 by way of the inner side connecting portion 110a and the wiring portion 110c.

Next, a method of fabricating the electronic part 100 according to the embodiment will be explained.

Figure 30B:
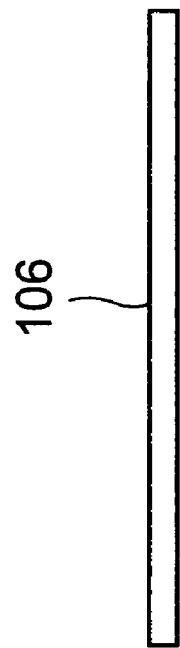
FIGS. 30A and 30B illustrate views showing a step of a method of fabricating the electronic part according to the sixth embodiment of the invention.
Figure 30A:
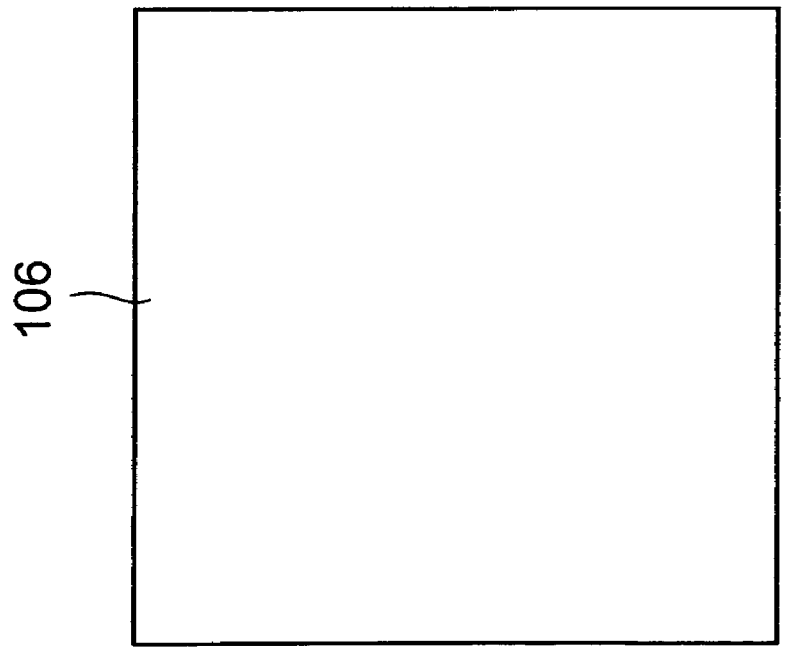

First, the base member 106 is machined to form. That is, as shown by FIGS. 30A and 30B, a wafer for the base member comprising glass or silicone is polished to a predetermined thickness and cleaned. Further, a work alterated layer at the topmost surface is removed by etching or the like. Further, although FIG. 30 clearly shows only the one base member 106 for simplifying explanation, actually, a plurality of the base members 106 are aligned at the wafer for the base member to be formed integrally therewith.

Further, the lid member 107 is machined to form. The lid member 107 is provided by, for example, forming a plurality of the recess portions 108 at one face of the wafer for the lid member comprising glass or silicon similar to the base member 106 and cutting to separate the respective individual lid members 107.

Successively, as shown by FIGS. 31A and 31B, the upper face of the base member 106 is formed with the lead-out electrode 110 comprising the inner side connecting portion 110a, the wiring portion 110c and the outer side connecting portion 110b (electrode forming step). That is, an electrode layer is formed at the upper face of the base member 106 by sputtering, vapor deposition or the like and the lead-out electrode 110 is integrally patterned by etching or the like.

Further, as shown by FIGS. 32A and 32B, the insulating film 112 is formed (insulating film forming step). That is, the insulating film 112 is formed by sputtering, vapor deposition, a gas phase growing method, a coating method or the like at an entire periphery of an edge portion of the upper face of the base member 106 to cover the lead-out electrode 110. Further, the thickness M1 of the insulating film 112 is thicker than the thickness M2 of the lead-out electrode 110 and is constituted by about several μm.

The upper face of the insulating film 112 is formed with the flattening portion 113 by flattening. Flattening of the insulating film 112 is similar to flattening of the insulating film 112 according to the first embodiment and therefore, an explanation thereof will be omitted here.

Successively, as shown by FIGS. 33A and 33B, the bonding film 114 is formed (bonding film forming step). That is, the bonding film 114 comprising a metal or silicone is formed by sputtering on the insulating film 112, vapor deposition, a gas phase growing method or the like.

Further, as shown by FIGS. 34A and 34B, the device 103 is mounted at the upper face of the base member 106 (device mounting step). That is, the device is arranged on the base member while accurately positioning the device such that the respective electrodes of the device 103 coincide with the inner side connecting portions 110a of the lead-out electrodes 110 and the electrodes corresponding to each other are connected. Thereby, the device 103 is fixed to the base member 106. Further, in mounting the device 103, the device 103 may directly be formed at the base member 106 or the lid member 107 by a thin film technology by a photolithography method or the like.

Figure 35:
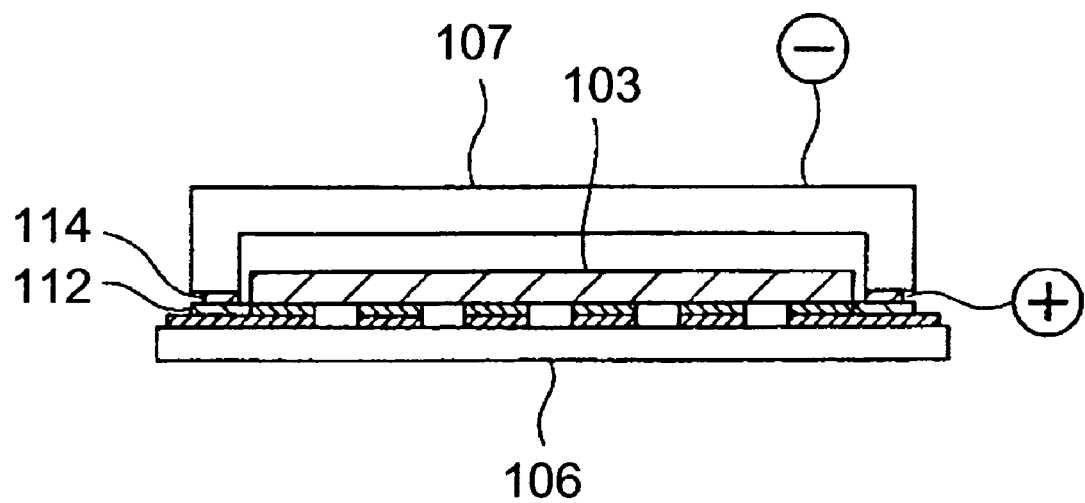
FIG. 35 is a sectional view showing a step of the method of fabricating the electronic part according to the sixth embodiment of the invention.

Next, as shown by FIG. 35, the lid member 107 is anodically bonded to the base member 106 mounted with the device 103 (bonding step).

In the case of anodic bonding, the lid member 107 made of glass is overlapped on the base member 106 mounted with the device 103 and respectively formed with the insulating film 112 and the bonding film 114 by sputtering, vapor deposition or the like in vacuum. At this occasion, the lid member 107 is accurately positioned relative to the base member 106 such that the recess portion 108 at the lower face of the lid member 107 is opposed to the device 103. Further, the bonding film 114 and the lid member 107 are brought into close contact with each other.

Under the state, the base member 106 and the lid member 107 are heated to a predetermined temperature and a predetermined voltage is applied therebetween (refer to FIG. 35). As a result, an electrostatic attraction force is generated between the bonding film 114 and the lower face of the lid member 107, the bonding film 114 and the lid member 107 are strongly brought into contact with each other to be anodically bonded. Thereby, the cavity portion 109 is sealed in airtight and the hermetically closed vessels 102 continuous in row and column directions are formed. Thereafter, the voltage is stopped to be applied, the wafer for the base member is gradually cooled to return to room temperature. During a time period in which temperatures of the wafer for the base member and the lid member are elevated to be returned to room temperature, the wafer for the base member and the lid member are thermally expanded by the temperature rise and contracted by being cooled gradually to recover to the original state.

Further, the wafer for the base member is cut in a dicing step. Thereby, the electronic part shown in FIGS. 29A and 29B is provided.

As described above, according to the electronic part 100 of the embodiment, since the insulating film 112 is provided between the bonding film 114 and the lead-out electrode 110 and therefore, the bonding film 114 and the lead-out electrode 110 are insulated from each other and are not interfered with each other. Therefore, the lead-out electrode 110 and the bonding film 114 can be prevented from being conducted to each other electrically. Further, it is not necessary to form a through hole at the base member 106 or the lid member 107 since the electronic part 103 is electrically connected to outside by way of the lead-out electrode 110. As a result, outside air does not invade from a clearance of the through hole and airtightness of inside of the hermetically sealed vessel can be maintained over a long period of time. Further, in comparison with the case of forming the through hole, when the lead-out electrode is formed, the lead-out electrodes can be arranged with a high density without bringing about a reduction in a strength and small-sized formation and high density formation of the electronic part 110 can reasonably be achieved by that amount.

Further, materials having thermal expansion coefficients near to each other of, for example, borosilicate glass or silicone can be used for the base member 106 and the lid member 107. Therefore, in the bonding step, deformation amounts thereof in thermal expansion and contraction can be matched and the base member 106 and the lid member 107 can firmly be bonded with excellent accuracy.

Further, since the insulating film 112 is provided over the lead-out electrode 110 and the bonding film 114 and the flattening portion 113 is provided at the upper face 112a of the insulating film 112, the upper face 112a can uniformly be leveled by absorbing a stepped difference between the lead-out electrode 110 and the bonding film 114 and the base member 106 and the lid member 107 can firmly be bonded with further excellent accuracy.

Further, although according to the example shown in FIGS. 29A and 29B, the base member 106 and the lid member 107 are anodically bonded, the invention is not limited thereto but the members 106 and 107 may be bonded at room temperature or directly bonded. Further, in bonding the members at room temperature, the bonding film 114 is not needed.

For example, when the members are bonded at room temperature, as a combination of the materials of the insulating film 114 and the lid member 107, an oxide film can be used as the insulating film 114 and silicone can be used as the lid member 107. First, flatnesses of the faces of the insulating film 114 and the lid member 107 opposed to each other are promoted. Successively, under high vacuum, high clean formation and activated formation of the faces opposed to each other are achieved by removing an organic substance or the like physically or chemically adsorbed to the surfaces by impact operation of ions by irradiating the faces opposed to each other with argon ions. Thereafter, by bringing the opposed faces into close contact with each other to be bonded to each other under high vacuum by which a contaminant is not adsorbed again to the topmost surface, bonding excellent in a bonding strength under a pressing force and a temperature which are sufficiently lower than those in a normal case. The bonding strength is practically sufficient since a tensile strength of 8 through 10 MPa in bonding silicone is achieved even at a vicinity of room temperature. According to the room temperature bonding method, the bonding temperature can be made to be low in this way, and therefore, degassing from a member by heating can be restrained to be sufficiently low.

Therefore, extremely excellent bonding is achieved in an electronic part for mounting a device which is considerably damaged thermally at inside thereof. At the same time, a getter for a countermeasure against degassing is not needed at inside of the hermetically sealed vessel and it is not necessary to install a step for activating the getter. Thereby, further small-sized formation of the hermetically closed vessel can be achieved.

Further, when opposed faces to be bonded can further be flattened, the faces can also be bonded by a direct bonding method. Direct bonding can easily be carried out by, for example, constituting the lid member 107 and a member (film) on a side of the base member 106 opposed thereto by the same kind of material (for example, silicone). When silicone is used as the lid member 107, first, a silicone film is formed on the insulating film 112 by means of sputtering, vapor deposition, a gas phase growing method or the like, the lid member and the film on the side of the base member are sufficiently flattened, thereafter, the bonding faces are subjected to a hydrophilic treatment by a chemical or pure water. Thereafter, the both members can be bonded by bringing the both members into close contact with each other under a pertinent pressing force and a temperature atmosphere of about 100° C. through 200° C. Further, when the both members are cleaned by irradiating argon ions before the hydrophilic treatment, bonding further excellent in the bonding strength can be carried out. In direct bonding, bonding can be carried out under the atmospheric pressure and therefore, an expensive vacuum treatment apparatus is not needed and direct bonding is excellent in productivity in comparison with room temperature bonding.

Further, although according to the above-described sixth embodiment, the lead-out electrode 110 and the insulating film 112 are respectively formed on the side of the base member 106, the invention is not limited thereto but the lead-out electrode 110 and the insulating film 112 may be formed on the side of the lid member 107.

Further, the technical range of the invention is not limited to the above-described embodiments but the invention can variously be changed within the range not deviated from the gist of the invention.

What is claimed is:

1. A piezoelectric vibrator comprising:
   a hermetically sealed vessel constituted by overlapping a lid member and a base member in a plate-like shape in a thickness direction;
   a piezoelectric vibrating piece provided at inside of the hermetically closed vessel;
   a lead-out electrode provided at an overlapping face of the lid member, electrically connected to the piezoelectric vibrating piece by way of a connecting portion, and extending the connecting portion to an edge portion of the overlapping face of the lid member;
   an external electrode electrically connected to the lead-out electrode from a side face of the hermetically closed vessel; and
   a bonding film comprising a metal or silicone provided between the overlapping face of the lid member and an overlapping face of the base member;
   wherein an insulating film is provided between at least the lead-out electrode and the bonding film in between the overlapping face of the lid member and the overlapping face of the base member.

2. The piezoelectric vibrator according to claim 1, wherein the lid member and the base member comprise glass; and
   wherein the lid member and the base member are anodically bonded by way of the bonding film.

3. The piezoelectric vibrator according to claim 1, wherein the overlapping face of the lid member comprises an electrode face at which the lead-out electrode is extended and a nonelectrode face; and
   wherein the insulating film is provided over the lead-out electrode and the nonelectrode face, and a surface of the insulating film on a side of the base member is formed with a flattening portion leveled by being flattened.

4. The piezoelectric vibrator according to claim 1, wherein at least three of the lead-out electrodes are provided.

5. The piezoelectric vibrator according to claim 4, wherein a plurality of the piezoelectric vibrating pieces are provided.

6. An oscillator, wherein the piezoelectric vibrator according to claim 1 is electrically connected to an integrated circuit as an oscillation piece.

7. An electronic apparatus comprising the piezoelectric vibrator according to claim 1.

* * * * *